United States Patent
Ishibashi et al.

(10) Patent No.: US 8,771,552 B2
(45) Date of Patent: *Jul. 8, 2014

(54) GROUP III NITRIDE CRYSTAL SUBSTRATE, EPILAYER-CONTAINING GROUP III NITRIDE CRYSTAL SUBSTRATE, SEMICONDUCTOR DEVICE AND METHOD OF MANUFACTURING THE SAME

(75) Inventors: Keiji Ishibashi, Itami (JP); Yusuke Yoshizumi, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 929 days.

This patent is subject to a terminal disclaimer.

(21) Appl. No.: 12/837,872

(22) Filed: Jul. 16, 2010

(65) Prior Publication Data

US 2011/0012233 A1   Jan. 20, 2011

Related U.S. Application Data

(60) Continuation-in-part of application No. 12/216,236, filed on Jul. 1, 2008, now Pat. No. 7,854,804, which is a division of application No. 11/473,122, filed on Jun. 23, 2006, now Pat. No. 7,416,604.

(30) Foreign Application Priority Data

Jun. 23, 2005 (JP) ................................. 2005-183111
Sep. 7, 2009 (JP) ................................. 2009-206109
Dec. 18, 2009 (JP) ................................. 2009-287970
Jan. 28, 2010 (WO) .................. PCT/JP2010/051158

(51) Int. Cl.
*H01B 1/00* (2006.01)

(52) U.S. Cl.
USPC ............. 252/500; 117/84; 117/106; 117/952; 257/13; 257/615; 257/627; 423/328.2; 428/698

(58) Field of Classification Search
USPC ............... 252/500; 117/84, 106, 952; 257/13, 257/615, 627; 423/328.2; 428/698
See application file for complete search history.

(56) References Cited

U.S. PATENT DOCUMENTS 5,679,152 A   10/1997   Tischler et al.
(Continued)

FOREIGN PATENT DOCUMENTS

CN   1610138 A   4/2005
(Continued)

OTHER PUBLICATIONS

Yohei Enya et al., "531nm Green Lasing of InGaN Based Laser Diodes on Semi-Polar {2021} Free-Standing GaN Substrates," Applied Physics Express 2 (2009), with English Translation.

(Continued)

*Primary Examiner* — Khanh Tuan Nguyen
(74) *Attorney, Agent, or Firm* — McDermott Will & Emery LLP

(57) ABSTRACT

A group III nitride crystal substrate is provided in which a uniform distortion at a surface layer of the crystal substrate represented by a value of $|d_1 - d_2|/d_2$ obtained from a plane spacing $d_1$ at the X-ray penetration depth of 0.3 μm and a plane spacing $d_2$ at the X-ray penetration depth of 5 μm is equal to or lower than $1.9 \times 10^{-3}$, and the main surface has a plane orientation inclined in the <10-10> direction at an angle equal to or greater than 10° and equal to or smaller than 80° with respect to one of (0001) and (000-1) planes of the crystal substrate. A group III nitride crystal substrate suitable for manufacturing a light emitting device with a blue shift of an emission suppressed, an epilayer-containing group III nitride crystal substrate, a semiconductor device and a method of manufacturing the same can thereby be provided.

9 Claims, 6 Drawing Sheets

(56) References Cited

U.S. PATENT DOCUMENTS

| | | | |
|---|---|---|---|
| 5,679,153 A | 10/1997 | Dmitriev et al. | |
| 6,280,523 B1 | 8/2001 | Coman et al. | |
| 6,396,083 B1 | 5/2002 | Ortiz et al. | |
| 6,488,767 B1 | 12/2002 | Xu et al. | |
| 6,596,079 B1 | 7/2003 | Vaudo et al. | |
| 6,656,615 B2 | 12/2003 | Dwilinski et al. | |
| 6,841,274 B2 | 1/2005 | Ueno et al. | |
| 6,875,544 B1 | 4/2005 | Sweatt et al. | |
| 6,951,695 B2 * | 10/2005 | Xu et al. | 428/698 |
| 7,416,604 B2 * | 8/2008 | Ishibashi et al. | 117/89 |
| 7,421,060 B2 | 9/2008 | Zienert et al. | |
| 2002/0028564 A1 | 3/2002 | Motoki et al. | |
| 2002/0192507 A1 | 12/2002 | Dwilinski et al. | |
| 2005/0082564 A1 | 4/2005 | Kitaoka et al. | |
| 2006/0035910 A1 | 2/2006 | Lochead et al. | |
| 2006/0236922 A1 | 10/2006 | Ishibashi et al. | |
| 2006/0237740 A1 | 10/2006 | Bousquet et al. | |
| 2006/0272572 A1 | 12/2006 | Uematsu et al. | |
| 2006/0273343 A1 | 12/2006 | Nakahata et al. | |
| 2006/0292728 A1 | 12/2006 | Ishibashi et al. | |
| 2007/0281484 A1 | 12/2007 | Ishibashi et al. | |
| 2008/0056449 A1 | 3/2008 | Zienert et al. | |
| 2008/0057608 A1 | 3/2008 | Ishibashi et al. | |
| 2008/0232416 A1 | 9/2008 | Okamoto et al. | |
| 2008/0271667 A1 | 11/2008 | Ishibashi et al. | |
| 2008/0272392 A1 | 11/2008 | Ishibashi et al. | |
| 2008/0283846 A1 | 11/2008 | Ohmae et al. | |
| 2008/0283851 A1 | 11/2008 | Akita | |
| 2008/0308906 A1 | 12/2008 | Osada et al. | |
| 2009/0104738 A1 | 4/2009 | Ring et al. | |
| 2009/0155989 A1 | 6/2009 | Uematsu et al. | |
| 2010/0224963 A1 | 9/2010 | Ishibashi et al. | |
| 2010/0227532 A1 | 9/2010 | Ishibashi et al. | |
| 2010/0230690 A1 | 9/2010 | Kyono et al. | |
| 2011/0031589 A1 | 2/2011 | Ishibashi | |
| 2011/0057200 A1 | 3/2011 | Kyono et al. | |
| 2011/0084363 A1 | 4/2011 | Ishibashi et al. | |
| 2011/0223701 A1 | 9/2011 | Kyono et al. | |

FOREIGN PATENT DOCUMENTS

| | | |
|---|---|---|
| CN | 1896343 A | 1/2007 |
| CN | 101350333 A | 1/2009 |
| CN | 101409231 A | 4/2009 |
| EP | 1 365 230 A2 | 11/2003 |
| EP | 1 717 286 A1 | 11/2006 |
| EP | 1 736 574 A1 | 12/2006 |
| EP | 1863074 A2 | 12/2007 |
| EP | 1897978 A1 | 3/2008 |
| JP | 05-087646 | 4/1993 |
| JP | 06-066740 | 3/1994 |
| JP | 10-256662 | 9/1998 |
| JP | 2001-36191 | 2/2001 |
| JP | 2001-322899 A | 11/2001 |
| JP | 2002-029897 A | 1/2002 |
| JP | 2002-289579 | 10/2002 |
| JP | 2003-112999 A | 4/2003 |
| JP | 2004-193371 | 7/2004 |
| JP | 2004-530306 | 9/2004 |
| JP | 2004-281671 A | 10/2004 |
| JP | 2004-311575 A | 11/2004 |
| JP | 2006-71354 | 3/2006 |
| JP | 2006-310362 A | 11/2006 |
| JP | 2007-005526 | 1/2007 |
| JP | 2008-010835 A | 1/2008 |
| JP | 2008-235802 | 10/2008 |
| JP | 2008-285364 A | 11/2008 |
| JP | 4305574 | 5/2009 |
| JP | 2009-170798 A | 7/2009 |
| JP | 2009-200437 | 9/2009 |
| JP | 4333820 B1 | 9/2009 |
| JP | 2009-238772 A | 10/2009 |
| JP | 4375497 B1 | 12/2009 |
| JP | 4518209 B1 | 8/2010 |
| WO | 0168955 A1 | 9/2001 |
| WO | WO 02/101121 A1 | 12/2002 |
| WO | WO 2005/041283 A1 | 5/2005 |

OTHER PUBLICATIONS

Yusuke Yoshizumi et al., "Continuous-Wave Operation of 520 nm Green InGaN-Based Laser Diodes on Semi-Polar {2021} GaN Substrates," Applied Physics Express 2 (2009), with English Translation.

Chinese Office Action, w/ English translation thereof, issued in Chinese Patent Application No. CN 200610093296.1 dated May 16, 2011.

Japanese Office Action, with English translation, issued in Japanese Patent Application No. 2008-334503, dated Jul. 12, 2011.

US Office Action issued in U.S. Appl. No. 12/216,237, dated Jul. 1, 2011.

Sung S. Park, et al., "Free-Standing GaN Substrates by Hydride Vapor Phase Epitaxy," Jpn J. Appl. Phys., Nov. 15, 2000, pp. L1141-L1142, vol. 39, The Japan Society of Applied Physics.

Yutaka Takahashi, et al., "Transmission Electron Microscopy of Surface Damages Resulting from Wet Polishing in a Polycrystalline Aluminum Nitride Substrate," The Academic Journal of the Ceramic Society of Japan, 1991, pp. 613-619, 99[7], The Ceramic Society of Japan.

Japanese Notice of Grounds of Rejection, w/ English translation thereof, issued in Japanese Patent Application No. JP 2005-183111 dated on Oct. 28, 2008.

Japanese Office Action, with English translation, issued in Japanese Patent Application No. 2009-064672, mailed Apr. 21, 2009.

Japanese Notice of Grounds of Rejection, w/ English translation thereof, issued in Japanese Patent Application No. JP 2009-170813 dated Aug. 25, 2009.

United States Office Action issued in U.S. Appl. No. 12/216,236 dated Sep. 3, 2009.

United States Office Action issued in U.S. Appl. No. 12/216,236, mailed Mar. 25, 2010.

Notice of Grounds of Rejection, with English translation, issued in Japanese Patent Application No. 2009-287970, mailed Mar. 9, 2010.

International Search Report, with English translation, issued in International Patent Application No. PCT/JP2010/051158, mailed Feb. 23, 2010.

U.S. Office Action issued in U.S. Appl. No. 12/216,237, mailed Apr. 27, 2009.

United States Office Action issued in United States Patent Application No. 12/216,237 dated Oct. 29, 2009.

United States Office Action issued in United States Patent Application No. 12/216,237, mailed Mar. 19, 2010.

Nikkan Kogyo Shimbun, Aug. 20, 2009 and partial English translation.

Nikkei Electronics, Aug. 24, 2009 and partial English translation.

Taiwan Office Action issued in Taiwanese Patent Application No. 095122536 dated Jul. 10, 2012.

Japanese Office Action, with English translation, issued in Japanese Patent Application No. 2010-117702, dated Mar. 27, 2012.

United States Notice of Allowance issued in U.S. Appl. No. 12/216,236, mailed Sep. 7, 2010.

Japanese Office Action issued in Japaense Application No. 2012-137811 dated Jun. 25, 2013 with English Translation.

Extended European Search Report issued in Euroepan Application No. 10837390.3 dated Oct. 10, 2013.

Office Action issued U.S. Appl. No. 13/935,360 mailed Dec. 6, 2013.

Japanese Notice of Grounds of Rejection, w/ English translation thereof, issued in Japanese Patent Application No. JP 2009-287590 dated May 24, 2011.

Japanese Notice of Grounds of Rejection, w/ English translation thereof, issued in Japanese Patent Application No. JP 2009-287590 dated Jul. 12, 2011.

Japanese Decision to Grant Patent, w/ English translation thereof, issued in Japanese Patent Application No. JP 2009-287590 dated Aug. 30, 2011.

International Search Report issued in International Patent Application No. PCT/JP2010/068840 dated Jan. 25, 2011.

(56) References Cited

OTHER PUBLICATIONS

International Search Report issued in International Patent Application No. PCT/JP2010/070290 dated Dec. 14, 2010.
Korean Office Action issued in Korean Patent Application No. KR 10-2011-0138617 dated Apr. 3, 2012.
United States Office Action issued in U.S. Appl. No. 12/216,237 dated Oct. 29 2009.
Chinese Office Action issued in Chinese Application No. 201080039771.1 dated Jan. 30, 2014, w/English translation.

* cited by examiner

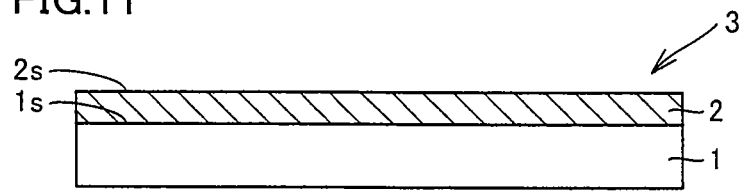
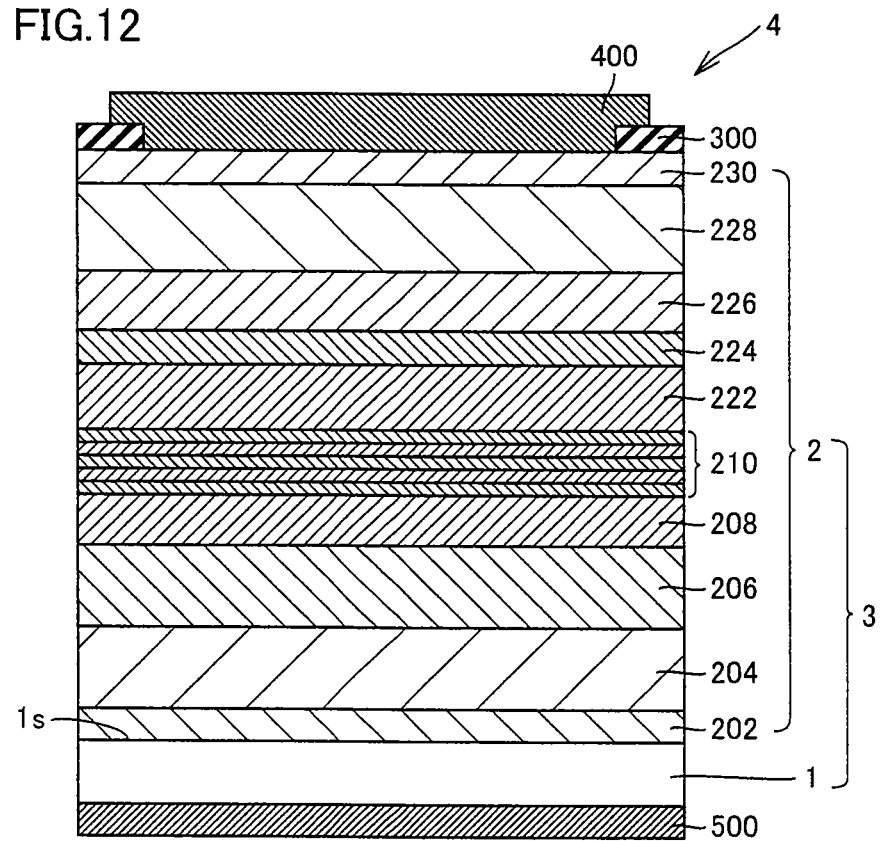

GROUP III NITRIDE CRYSTAL SUBSTRATE, EPILAYER-CONTAINING GROUP III NITRIDE CRYSTAL SUBSTRATE, SEMICONDUCTOR DEVICE AND METHOD OF MANUFACTURING THE SAME

This application is a Continuation-In-Part (CIP) of application Ser. No. 12/216,236, filed Jul. 1, 2008, now U.S. Pat. No. 7,854,804, which is a Divisional of application Ser. No. 11/473,122, filed Jun. 23, 2006, now U.S. Pat. No. 7,416,604 which claims priority of Japanese Patent Application No. 2005-183111, filed Jun. 23, 2005. The entire contents of each of the foregoing applications are hereby incorporated by reference.

This application also claims priority to International Patent Application No. PCT/JP2010/051158, filed Jan. 28, 2010, which claims priority of Japanese Patent Application No. 2009-206109, filed Sep. 7, 2009 and Japanese Patent Application No. 2009-287970, filed Dec. 18, 2009. The entire contents of each of the foregoing applications are hereby incorporated by reference.

BACKGROUND OF THE INVENTION

1. Field of the Invention

The present invention relates to a group III nitride crystal substrate, an epilayer-containing group III nitride crystal substrate, a semiconductor device and a method of manufacturing the same, and particularly to a group III nitride crystal substrate that can be preferably used as a substrate for growing an epitaxial crystal semiconductor layer when producing a semiconductor device.

2. Description of the Background Art

As is well known, various devices using nitride semiconductor crystals (e.g., group III nitride crystals) have been produced in recent years, and nitride semiconductor light emitting devices (e.g., group III nitride semiconductor light emitting devices) have been produced as a typical example of such semiconductor devices.

Generally, in a process of manufacturing a nitride semiconductor device, a plurality of nitride semiconductor layers (e.g., group III nitride semiconductor layers) are epitaxially grown on a substrate. Crystal quality of the epitaxially grown nitride semiconductor layer is affected by a state of a surface layer of the substrate used for the epitaxial growth, and this quality affects performance of the semiconductor device including the nitride semiconductor layer. Therefore, in the case where the nitride semiconductor crystal is used as the above kind of substrate, it is desired that at least a main surface of the substrate providing a base of epitaxial growth has a smooth form without a distortion.

More specifically, the main surface of the nitride semiconductor substrate used for the epitaxial growth is generally subjected to smoothing processing and distortion removal processing. Among various compound semiconductors, gallium-nitride-based semiconductors are relatively hard so that the surface smoothing processing thereof is not easy, and the distortion removal processing after the smoothing processing is not easy.

U.S. Pat. No. 6,596,079 (Patent Document 1) has disclosed a method of forming a substrate surface in the case where the substrate is produced from an (AlGaIn)N bulk crystal grown by vapor phase epitaxy on an (AlGaIn)N seed crystal, and more specifically a method of forming a substrate surface that has an RMS (Root Mean Square) surface roughness of 1 nm or lower, and does not have a surface damage owing to effecting CMP (Chemical-Mechanical Polishing) or etching on the substrate surface subjected to mechanical polishing. U.S. Pat. No. 6,488,767 (Patent Document 2) has disclosed an $Al_xGa_y$-$In_zN$ ($0<y\le1$, $x+y+z=1$) substrate having an RMS surface roughness of 0.15 nm attained by the CMP processing. A processing agent for this CMP contains $Al_2O_3$ grains, $SiO_2$ grains, pH controlling agent and oxidizer.

In the prior art, as described above, the CMP processing or dry etching is effected after mechanically polishing the GaN crystal so that the process-induced degradation layer formed by the mechanical polishing is removed, and the GaN substrate having the finished substrate surface is formed. However, the processing rate of the CMP processing is low, and causes problems in cost and productivity. Further, the dry etching causes a problem in surface roughness.

The finishing method of the Si substrate using the CMP as well as the polishing agent for the method are not suitable for the hard nitride semiconductor substrate, and lower the removal speed of the surface layer. In particular, GaN is chemically stable, and is relatively resistant to the wet etching so that the CMP processing is not easy. Although the dry etching can remove the nitride semiconductor surface, it does not have an effect of flattening the surface in a horizontal direction so that the surface smoothing effect cannot be achieved.

For epitaxially growing the compound semiconductor layer of good crystal quality on the main surface of the substrate, it is necessary to use the substrate surface having a surface layer of good crystal quality as well as less process damage and less distortion as described above. However, the crystal quality of the surface layer that is required at the main surface of the substrate is not clear.

SUMMARY OF THE INVENTION

Each of substrates illustrated in U.S. Pat. No. 6,596,079 (Patent Document 1) and U.S. Pat. No. 6,488,767 (Patent Document 2) is made of hexagonal wurtzite group III nitride crystals, with the main surface implemented by (0001) planes. In a light emitting device which is a semiconductor device including at least one semiconductor layer epitaxially grown on the main surface of such a crystal substrate, with the main surface of the semiconductor layer also implemented by the (0001) planes, the (0001) planes being polar planes that change polarity in the direction normal to the planes, the quantum-confined Stark effect resulting from piezoelectric polarization caused by such polarity leads to a large blue shift of an emission accompanied by an increased amount of current injection, and results in lower emission intensity.

To manufacture a light emitting device with a blue shift of the emission suppressed, it is required to reduce the polarity at the main surface of a substrate used in manufacturing the light emitting device, in other words, to implement the main surface of the substrate by planes different from the (0001) planes.

However, the substrate suitable for manufacturing the light emitting device with a blue shift of the emission suppressed has not been clarified concerning the plane orientation of its main surface, the surface roughness of its main surface, the crystallinity of its surface layer, and the like.

It is therefore an object of the present invention to provide a group III nitride crystal substrate suitable for manufacturing a light emitting device with a blue shift of the emission suppressed, an epilayer-containing group III nitride crystal substrate, a semiconductor device and a method of manufacturing the same.

According to an embodiment of the invention, in a group III nitride crystal substrate, wherein a plane spacing of arbitrary specific parallel crystal lattice planes of the crystal substrate being obtained from X-ray diffraction measurement performed with variation of X-ray penetration depth from a main surface of the crystal substrate while X-ray diffraction conditions of the specific parallel crystal lattice planes of the crystal substrate are satisfied, a uniform distortion at a surface layer of the crystal substrate represented by a value of $|d_1 - d_2|/d_2$ obtained from a plane spacing $d_1$ at the X-ray penetration depth of 0.3 μm and a plane spacing $d_2$ at the X-ray penetration depth of 5 μm is equal to or lower than $1.9 \times 10^{-3}$, and the main surface has a plane orientation inclined in a <10-10> direction at an angle equal to or greater than 10° and equal to or smaller than 80° with respect to one of (0001) and (000-1) planes of the crystal substrate.

According to another embodiment of the invention, in a group III nitride crystal substrate, wherein on a diffraction intensity profile of arbitrary specific parallel crystal lattice planes of the crystal substrate being obtained from X-ray diffraction measurement performed with variation of X-ray penetration depth from a main surface of the crystal substrate while X-ray diffraction conditions of the specific parallel crystal lattice planes are satisfied, an irregular distortion at a surface layer of the crystal substrate represented by a value of $|v_1 - v_2|$ obtained from a half value width $v_1$ of a diffraction intensity peak at the X-ray penetration depth of 0.3 μm and a half value width $v_2$ of the diffraction intensity peak at the X-ray penetration depth of 5 μm is equal to or lower than 130 arcsec, and the main surface has a plane orientation inclined in a <10-10> direction at an angle equal to or greater than 10° and equal to or smaller than 80° with respect to one of (0001) and (000-1) planes of the crystal substrate.

According to a still another embodiment of the invention, in a group III nitride crystal substrate, wherein on a rocking curve being measured by varying an X-ray penetration depth from a main surface of the crystal substrate in connection with X-ray diffraction of arbitrary specific parallel crystal lattice planes of the crystal substrate, a plane orientation deviation of the specific parallel crystal lattice planes of the surface layer of the crystal substrate represented by a value of $|w_1 - w_2|$ obtained from a half value width $w_1$ of a diffraction intensity peak at the X-ray penetration depth of 0.3 μm and a half value width $w_2$ of the diffraction intensity peak at the X-ray penetration depth of 5 μm is equal to or lower than 350 arcsec, and the main surface has a plane orientation inclined in a <10-10> direction at an angle equal to or greater than 10° and equal to or smaller than 80° with respect to one of (0001) and (000-1) planes of the crystal substrate.

In the above group III nitride crystal substrate, the main surface can have a surface roughness Ra of 3 nm or lower. The main surface of the group III nitride crystal substrate can have a plane orientation inclined at an angle falling within ±4° with respect to any of {20-21}, {10-11}, {20-2-1}, and {10-1-1} planes of the crystal substrate. The main surface can have a plane orientation inclined at an inclination angle having an absolute value of less than 0.1° with respect to any of the {20-21}, {10-11}, {20-2-1}, and {10-1-1} planes of the crystal substrate so as to be substantially parallel thereto. The main surface can have a plane orientation inclined at an inclination angle having an absolute value of equal to or more than 0.1° and equal to or less than 4° with respect to any of the {20-21}, {10-11}, {20-2-1}, and {10-1-1} planes of the crystal substrate. The oxygen present at the main surface of the group III nitride crystal substrate can have a concentration of equal to or more than 2 at. % and equal to or less than 16 at. %. The dislocation density at the main surface of the group III nitride crystal substrate can be equal to or less than $1 \times 10^7$ cm$^{-2}$. The group III nitride crystal substrate can have a diameter equal to or more than 40 mm and equal to or less than 150 mm. The specific parallel crystal lattice planes can be not parallel to the main surface, and can be parallel to any of (10-10), (10-11), (10-13), (11-20), (11-22), (11-24), (10-1-1), (10-1-3), (11-2-2), and (11-2-4) planes.

According to a still another embodiment of the invention, an epilayer-containing group III nitride crystal substrate includes at least one semiconductor layer provided by epitaxial growth on the main surface of the group III nitride crystal substrate.

According to a still another embodiment of the invention, a semiconductor device includes the epilayer-containing group III nitride crystal substrate. In the semiconductor device, the semiconductor layer contained in the epilayer-containing group III nitride crystal substrate can include a light emitting layer emitting light having a peak wavelength equal to or more than 430 nm and equal to or less than 550 nm.

According to a still another embodiment of the invention, a method of manufacturing a semiconductor device includes the steps of: preparing a group III nitride crystal substrate, wherein, a plane spacing of arbitrary specific parallel crystal lattice planes of the crystal substrate being obtained from X-ray diffraction measurement performed with variation of X-ray penetration depth from a main surface of the crystal substrate while X-ray diffraction conditions of the specific parallel crystal lattice planes of the crystal substrate are satisfied, a uniform distortion at a surface layer of the crystal substrate represented by a value of $|d_1-d_2|/d_2$ obtained from a plane spacing $d_1$ at the X-ray penetration depth of 0.3 μm and a plane spacing $d_2$ at the X-ray penetration depth of 5 μm is equal to or lower than $1.9 \times 10^{-3}$, and the main surface has a plane orientation inclined in a <10-10> direction at an angle equal to or greater than 10° and equal to or smaller than 80° with respect to one of (0001) and (000-1) planes of the crystal substrate; and epitaxially growing at least one semiconductor layer on the main surface of the crystal substrate, thereby forming an epilayer-containing group III nitride crystal substrate.

According to a still another embodiment of the invention, a method of manufacturing a semiconductor device includes the steps of: preparing a group III nitride crystal substrate, wherein, on a diffraction intensity profile of arbitrary specific parallel crystal lattice planes of the crystal substrate being obtained from X-ray diffraction measurement performed with variation of X-ray penetration depth from a main surface of the crystal substrate while X-ray diffraction conditions of the specific parallel crystal lattice planes are satisfied, an irregular distortion at a surface layer of the crystal substrate represented by a value of $|v_1 - v_2|$ obtained from a half value width $v_1$ of a diffraction intensity peak at the X-ray penetration depth of 0.3 μm and a half value width $v_2$ of the diffraction intensity peak at the X-ray penetration depth of 5 μm is equal to or lower than 130 arcsec, and the main surface has a plane orientation inclined in a <10-10> direction at an angle equal to or greater than 10° and equal to or smaller than 80° with respect to one of (0001) and (000-1) planes of the crystal substrate; and epitaxially growing at least one semiconductor layer on the main surface of the crystal substrate, thereby forming an epilayer-containing group III nitride crystal substrate.

According to a still another embodiment of the invention, a method of manufacturing a semiconductor device includes the steps of: preparing a group III nitride crystal substrate, wherein, on a rocking curve being measured by varying an X-ray penetration depth from a main surface of the crystal substrate in connection with X-ray diffraction of arbitrary specific parallel crystal lattice planes of the crystal substrate, a plane orientation deviation of the specific parallel crystal lattice planes of the surface layer of the crystal substrate represented by a value of $|w_1-w_2|$ obtained from a half value width $w_1$ of a diffraction intensity peak at the X-ray penetration depth of 0.3 μm and a half value width $w_2$ of the diffraction intensity peak at the X-ray penetration depth of 5 μm is equal to or lower than 350 arcsec, and the main surface has a plane orientation inclined in a <10-10> direction at an angle equal to or greater than 10° and equal to or smaller than 80° with respect to one of (0001) and (000-1) planes of the crystal substrate; and forming an epilayer-containing group III nitride crystal substrate by epitaxially growing at least one semiconductor layer on the main surface of the crystal substrate.

In the step of forming the epilayer-containing group III nitride crystal substrate in the method of manufacturing a semiconductor device, the semiconductor layer can be configured to include a light emitting layer emitting light having a peak wavelength equal to or more than 430 nm and equal to or less than 550 nm. In the method of manufacturing a semiconductor device, the specific parallel crystal lattice planes can be not parallel to the main surface, and can be parallel to any of (10-10), (10-11), (10-13), (11-20), (11-22), (11-24), (10-1-1), (10-1-3), (11-2-2), and (11-2-4) planes.

The present invention can provide a group III nitride crystal substrate suitable for manufacturing a light emitting device with a blue shift of an emission suppressed and having an increased emission intensity, an epilayer-containing group III nitride crystal substrate, a semiconductor device and a method of manufacturing the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a schematic section showing an example of an epilayer-containing group III nitride crystal substrate according to the present invention.

FIG. 12 is a schematic section showing an example of a semiconductor device according to the present invention.

DESCRIPTION OF THE PREFERRED EMBODIMENTS

[Group III Nitride Crystal Substrate]

In crystallography, notation (Miller notation) such as (hkl) or (hkil) is employed to indicate plane orientations of a crystal surface. Plane orientations of a crystal surface of a hexagonal crystal, such as a group III nitride crystal constituting a group III nitride crystal substrate, are represented by (hkil). Herein, h, k, i, and l are integers called Miller indices, having a relationship of $i=-(h+k)$. A plane having the plane orientation (hkil) is called a (hkil) plane. Throughout the present specification, each individual plane orientation is represented by (hkil), and a family of plane orientations including (hkil) and its crystallographically equivalent plane orientations is represented by {hkil}. Each individual direction is represented by [hkil], and a family of directions including [hkil] and its crystallographically equivalent directions is represented by <hkil>. Throughout the present specification, a negative index is represented by a number indicative of the index with a minus sign (–) added in front of the number, although, in crystallography, generally represented by a number indicative of the index with "-" (bar) added thereon.

A group III nitride crystal has polarity in the <0001> direction, since group III element atomic planes and nitrogen atomic planes are arrayed alternately in the <0001> direction. In the present invention, the crystal axes are determined such that the group III element atomic planes are implemented by the (0001) planes and the nitrogen atomic planes are implemented by the (000-1) planes.

The invention employs an X-ray diffraction method, and thereby can perform direct evaluation of crystallinity at a surface layer of a group III nitride crystal substrate without breaking the crystal. The evaluation of the crystallinity represents evaluation or determination of an extent or degree to which a distortion of the crystal is present, and more specifically represents evaluation of an extent or degree to which a distortion of a crystal lattice and a plane orientation deviation of the crystal lattice plane are present. The distortion of the crystal lattice can be specifically classified into a uniform distortion caused by a uniformly distorted crystal lattice and an irregular distortion caused by an irregularly distorted crystal lattice. The plane orientation deviation of the crystal lattice planes represent a magnitude by which the plane orientation of the lattice plane of each crystal lattice deviates from an average orientation of the plane orientation of the lattice planes of the whole crystal lattice.

Figure 1:
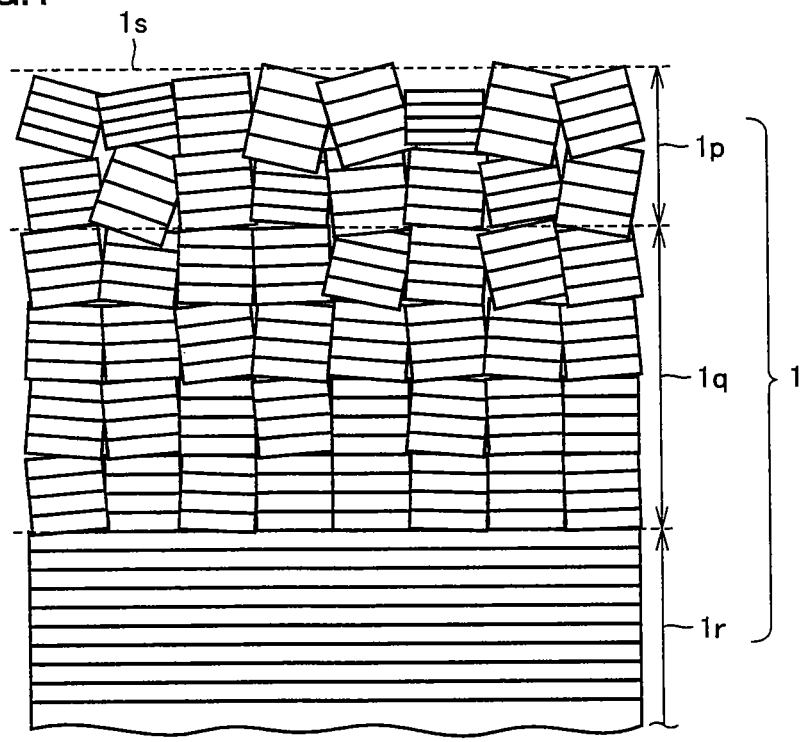
FIG. 1 is a schematic section showing a state of a crystal in a depth direction from a main surface of a group III nitride crystal substrate.

As shown in FIG. 1, a group III nitride crystal substrate 1 has a surface layer 1p in a certain depth direction from a main surface 1s of the crystal substrate, and a uniform distortion, an irregular distortion and a plane orientation deviation of a crystal lattice (i.e., at least one of the uniform distortion, irregular distortion and plane orientation deviation of the crystal lattice) occur in surface layer 1p due to processing such as cutting from a group III nitride crystal substance, grinding or polishing. The uniform distortion, irregular distortion and plane orientation deviation of the crystal lattice (i.e., at least one of the uniform distortion, irregular distortion and plane orientation deviation of the crystal lattice) may occur in a surface-neighboring layer 1q neighboring to surface layer 1p (FIG. 1 shows a case where the plane orientation deviation of the crystal lattice is present). Further, it can be considered that an inner layer 1r located inside surface-neighboring layer 1q has an original crystal structure of the crystal. The states and thicknesses of surface layer 1p and surface-neighboring layer 1q depend on the manner and extent of the grinding or polishing in the surface processing.

In the above structure, the uniform distortion, irregular distortion and/or plane orientation deviation of the crystal lattice are evaluated in the depth direction from the main surface of the crystal substrate so that the crystallinity of the surface layer can be directly and reliably evaluated.

In the X-ray diffraction measurement for evaluating the crystallinity of the surface layer of the group III nitride crystal substrate according to the invention, an X-ray penetration depth from the main surface of the crystal substrate is changed while X-ray diffraction conditions of arbitrary specific parallel crystal lattice planes of the group III nitride crystal substrate are satisfied.

Figure 2:
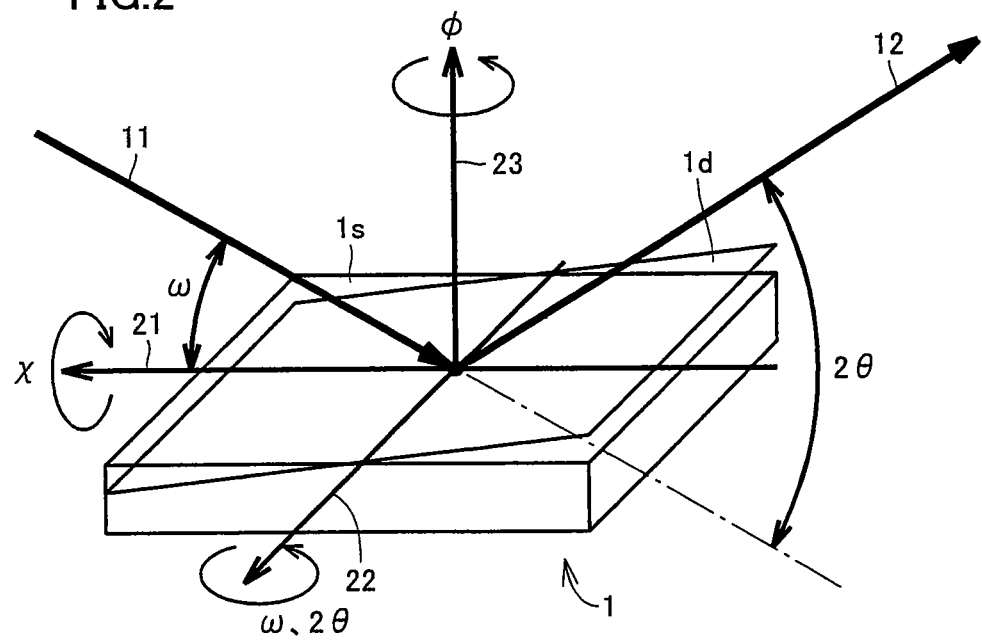
FIG. 2 is a schematic view showing measurement axes and measurement angles in an X-ray diffraction method applied to the present invention.

Referring to FIGS. 1 and 2, the diffraction conditions of the arbitrary specific parallel crystal lattice planes represent conditions under which the arbitrarily specified crystal lattice planes diffract the X-ray. Assuming that a Bragg angle is θ, a wavelength of the X-ray is λ and a plane spacing of specific parallel crystal lattice planes 1d is d, the X-ray is diffracted by the crystal lattice planes satisfying the Bragg's condition (2d sin θ=nλ, where n is an integer).

The X-ray penetration depth represents a distance that is measured in the depth direction perpendicular to main surface 1s of the crystal substrate when an intensity of the incident X-ray is equal to 1/e where e is a base of the natural logarithm. Referring to FIG. 2, an X-ray linear absorption coefficient μ of group III nitride crystal substrate 1, an inclination angle χ of main surface 1s of the crystal substrate, an X-ray incident angle ω with respect to main surface 1s of the crystal substrate and Bragg angle θ determine X-ray penetration depth T that is expressed by an equation (1). A χ axis 21 is present in a plane formed by an incident X-ray 11 and an outgoing X-ray 12, a ω axis (2θaxis) 22 is perpendicular to the plane formed by incident X-ray 11 and outgoing X-ray 12, and a φ axis 23 is perpendicular to main surface 1s of the crystal substrate. A φ represents a rotation angle in main surface 1s of the crystal substrate.

$$T = \frac{1}{\mu} \cdot \frac{\cos\chi \cdot \sin\omega \cdot \sin(2\theta - \omega)}{\sin\omega + \sin(2\theta - \omega)} \quad (1)$$

Therefore, X-ray penetration depth T can be continuously changed by adjusting at least one of χ, ω and φ to satisfy the diffraction conditions for the above specific parallel crystal lattice planes.

For continuously changing X-ray penetration depth T to satisfy the diffraction conditions for a specific parallel crystal lattice plane 1d, it is necessary that specific parallel crystal lattice plane 1d is not parallel to main surface 1s of the crystal substrate. If specific parallel crystal lattice plane is parallel to the main surface of the crystal substrate, the angle θ between specific parallel crystal lattice plane 1d and incident X-ray 11 becomes equal to the angle θ between main surface 1s of the crystal substrate and incident X-ray 11 so that the X-ray penetration depth cannot be changed at specific parallel crystal lattice plane 1d. The specific parallel crystal lattice planes are not particularly restricted unless they are not parallel to the main surface of the crystal substrate as described above, but from the viewpoint of facilitating the evaluation by X-ray diffraction at a desired penetration depth, the specific parallel crystal lattice planes are preferably implemented by planes parallel to the (10-10), (10-11), (10-13), (11-20), (11-22), (11-24), (10-1-1), (10-1-3), (11-2-2), (11-2-4) planes, and the like. More preferably, the specific parallel crystal lattice planes are implemented by the (10-10), (10-11), (10-13), (11-20), (11-22), (11-24), (10-1-1), (10-1-3), (11-2-2), (11-2-4) planes, and the like.

The arbitrary specific parallel crystal lattice planes of the crystal substrate are irradiated with the X-ray while changing the X-ray penetration depth to evaluate the uniform distortion of the crystal lattice from the change in plane spacing on the diffraction profile relating to the specific parallel crystal lattice planes, the irregular distortion of the crystal lattice from the change in half value width of the diffraction peak on the diffraction profile, and the plane orientation deviation of the crystal lattice from the change in half value width on the rocking curve.

Figure 6:
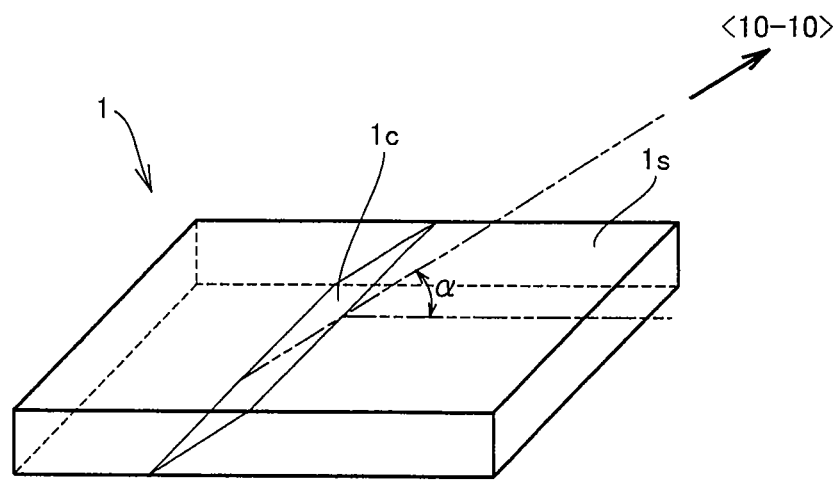
FIG. 6 schematically illustrates an example of a group III nitride crystal substrate according to the present invention.
Figure 7:
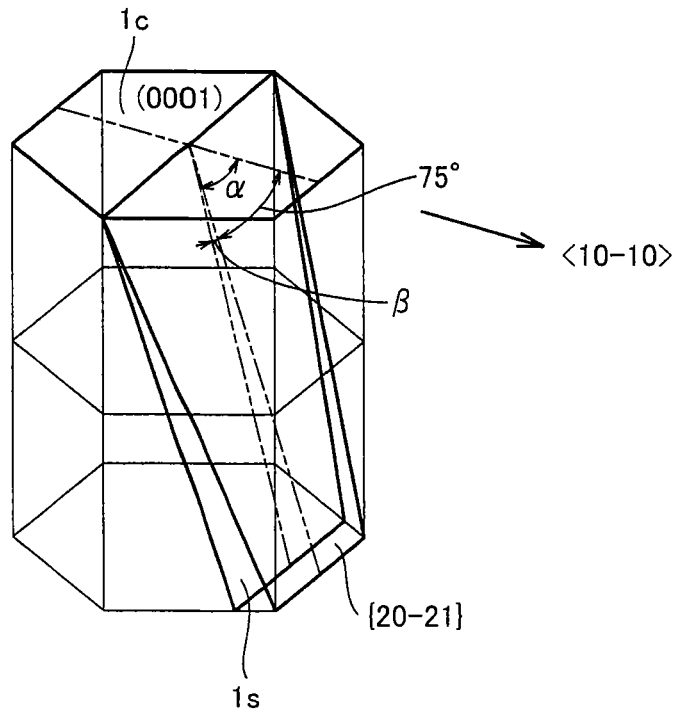
FIG. 7 schematically illustrates an example of inclination of a plane orientation of the main surface of the group III nitride crystal substrate according to the present invention in a <10-10> direction with respect to (0001) planes.
Figure 8:
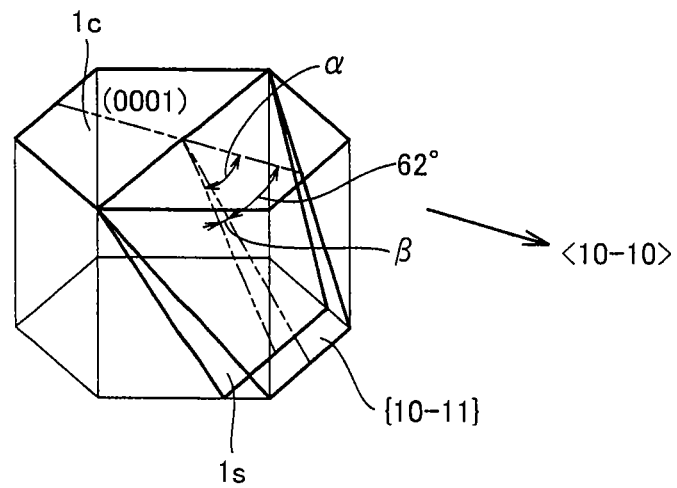
FIG. 8 schematically illustrates another example of inclination of the plane orientation of the main surface of the group III nitride crystal substrate according to the present invention in the <10-10> direction with respect to the (0001) planes.
Figure 9:
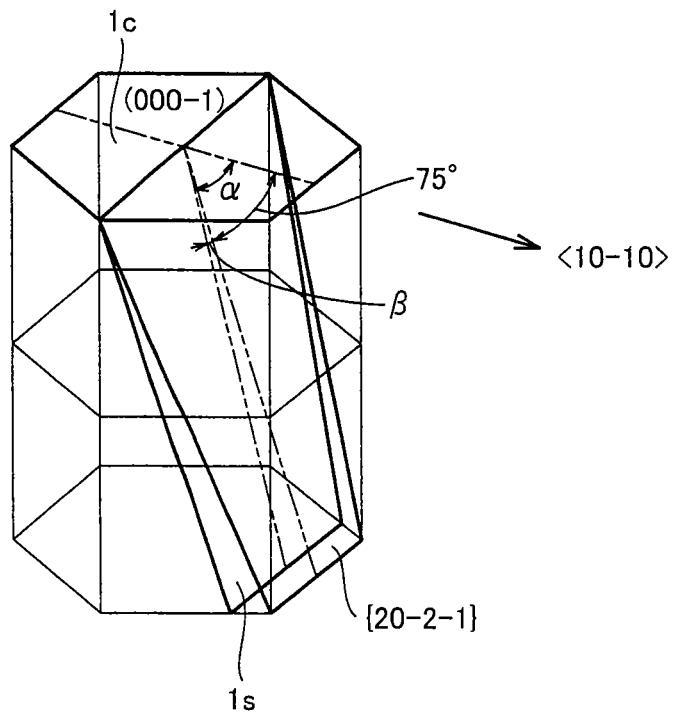
FIG. 9 schematically illustrates an example of inclination of the plane orientation of the main surface of the group III nitride crystal substrate according to the present invention in the <10-10> direction with respect to (000-1) planes.
Figure 10:
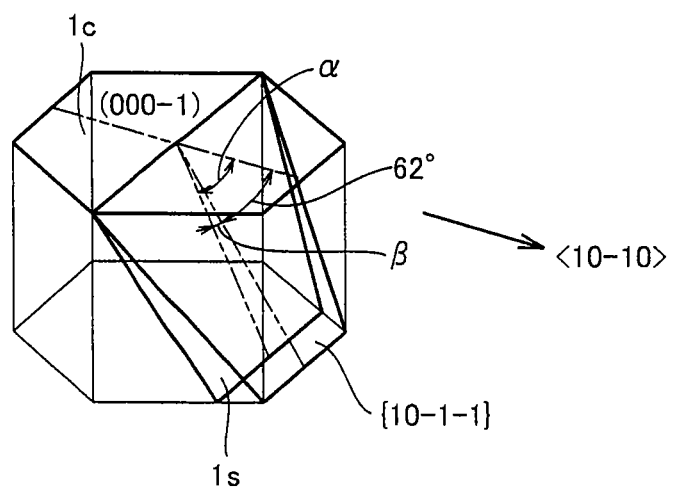
FIG. 10 schematically illustrates another example of inclination of the plane orientation of the main surface of the group III nitride crystal substrate according to the present invention in the <10-10> direction with respect to the (000-1) planes.

Referring to FIG. 6, main surface 1s of group III nitride crystal substrate 1 according to the present invention has a plane orientation inclined in the <10-10> direction at an inclination angle α equal to or greater than 10° and equal to or smaller than 80° with respect to one of the (0001) and (000-1) planes 1c of the crystal substrate. Owing to the fact that the main surface of the group III nitride crystal substrate has a plane orientation inclined in the <10-10> direction at inclination angle α equal to or greater than 10° with respect to one of the (0001) and (000-1) planes 1c, in a light emitting device which is a semiconductor device including at least one semiconductor layer epitaxially grown on the main surface of the crystal substrate, piezoelectric polarization of a light emitting layer in the semiconductor layer is suppressed to reduce the quantum-confined Stark effect, facilitating recombination of holes and electrons, which increases the radiative transition probability. This suppresses a blue shift in the light emitting device, and increases the integrated intensity of emission. Owing to the fact that the main surface of the group III nitride crystal substrate has a plane orientation inclined in the <10-10> direction at inclination angle α equal to or smaller than 80° with respect to one of the (0001) and (000-1) planes 1c, in the light emitting device which is a semiconductor device including at least one semiconductor layer epitaxially grown on the main surface of the crystal substrate, the dislocation density of the light emitting layer in the semiconductor layer is decreased, which achieves an increased integrated intensity of emission. From these viewpoints, inclination angle α of the plane orientation of the main surface of the group III nitride crystal substrate in the <10-10> direction with respect to one of the (0001) and (000-1) planes is preferably equal to or greater than 16° and equal to or smaller than 80°, more preferably equal to or greater than 45° and equal to or smaller than 79°, further preferably equal to or greater than 63° and equal to or smaller than 79°. Inclination angle α of the main surface in the <10-10> direction with respect to one of the (0001) and (000-1) planes can be measured by an X-ray diffraction method or the like.

(First Embodiment)

Referring to FIGS. 1, 2, 3 and 6, in group III nitride crystal substrate 1 according to an embodiment of the present invention, in connection with plane spacing of arbitrary specific parallel crystal lattice planes 1$d$ (specific parallel crystal lattice planes 1$d$ include specific parallel crystal lattice planes 31$d$, 32$d$ and 33$d$ of respective crystal lattices; the same applies throughout the present embodiment) obtained from X-ray diffraction measurement performed with variation of X-ray penetration depth from main surface 1$s$ of the crystal substrate while X-ray diffraction conditions of specific parallel crystal lattice planes 1$d$ of group III nitride crystal substrate 1 are satisfied, a uniform distortion at surface layer 1$p$ of the crystal substrate represented by a value of $|d_1-d_2|/d_2$ obtained from a plane spacing $d_1$ at the X-ray penetration depth of 0.3 μm and a plane spacing $d_2$ at the X-ray penetration depth of 5 μm is equal to or less than $1.9 \times 10^{-3}$, and main surface 1$s$ has a plane orientation inclined in the <10-10> direction at an angle equal to or greater than 10° and equal to or smaller than 80° with respect to one of the (0001) and (000-1) planes 1$c$ of the crystal substrate.

Owing to the fact that the uniform distortion at surface layer 1$p$ of group III nitride crystal substrate 1 according to the present embodiment is equal to or less than $1.9 \times 10^{-3}$, and main surface 1$s$ has a plane orientation inclined in the <10-10> direction at inclination angle α equal to or greater than 10° and equal to or smaller than 80° with respect to one of the (0001) and (000-1) planes 1$c$, a blue shift can be suppressed and the integrated intensity of emission can be increased in the light emitting device which is a semiconductor device including at least one semiconductor layer epitaxially grown on main surface 1$s$ of the crystal substrate. From these viewpoints, the uniform distortion at surface layer 1$p$ is preferably equal to or less than $1.4 \times 10^{-3}$, and more preferably equal to or less than $1.0 \times 10^{-3}$. The uniform distortion at surface layer 1$p$ is preferably as small as possible, and is reduced to approximately $0.4 \times 10^{-3}$ by adjusting processing conditions for the main surface of the crystal substrate in the present invention as will be described later. Inclination angle α of the plane orientation of main surface 1$s$ is preferably equal to or greater than 16° and equal to or smaller than 80°, more preferably equal to or greater than 45° and equal to or smaller than 79°, and further preferably equal to or greater than 63° and equal to or smaller than 79°.

Figure 3:
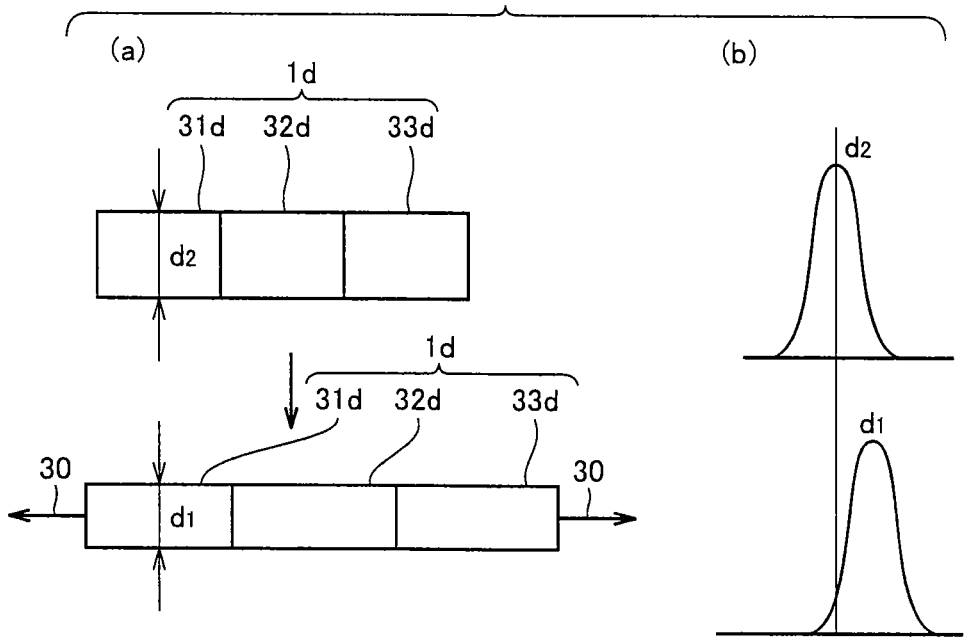
FIG. 3 schematically illustrates a relationship between a uniform distortion of a crystal lattice of the group III nitride crystal substrate and plane spacing of specific parallel crystal lattice planes shown on a diffraction profile in the X-ray diffraction method. At (a), the uniform distortion of the crystal lattice is illustrated. At (b), the plane spacing of the specific parallel crystal lattice planes is shown on the diffraction profile.

Referring to FIG. 1, the X-ray penetration depth of 0.3 μm corresponds to a distance from main surface 1$s$ of group III nitride crystal substrate 1 to an inside of surface layer 1$p$, and the X-ray penetration depth of 5 μm corresponds to a distance from main surface 1$s$ of group III nitride crystal substrate 1 to an inside of inner layer 1$r$. Referring to FIG. 3($a$), plane spacing $d_2$ at the X-ray penetration depth of 5 μm can be considered as the plane spacing of specific parallel crystal lattice planes 1$d$ of the group III nitride crystal in the original state, but plane spacing $d_1$ at the X-ray penetration depth of 0.3 μm reflects the uniform distortion of the crystal lattice at surface layer 1$p$ due to an influence of surface processing of the crystal substrate (e.g., a tensile stress 30 in a direction parallel to specific parallel crystal lattice planes 1$d$), and therefore takes a value different from plane spacing $d_2$ at the X-ray penetration depth of 5 μm.

Referring to FIG. 3($b$), plane spacing $d_1$ at the X-ray penetration depth of 0.3 μm and plane spacing $d_2$ at the X-ray penetration depth of 5 μm appear on the diffraction profile relating to arbitrary specific parallel crystal lattice planes 1$d$ of the crystal substrate in the above case. Therefore, the uniform distortion of the surface layer can be expressed by the value of a ratio $|d_1-d_2|/d_2$ of a difference between $d_1$ and $d_2$ with respect to $d_2$.

(Second Embodiment)

Referring to FIGS. 1, 2, 4 and 6, in group III nitride crystal substrate 1 according to another embodiment of the present invention, on a diffraction intensity profile of arbitrary specific parallel crystal lattice planes 1$d$ (specific parallel crystal lattice planes 1$d$ include specific parallel crystal lattice planes 41$d$, 42$d$, 43$d$ of respective crystal lattices; the same applies throughout the present embodiment) obtained from X-ray diffraction measurement performed with variation of X-ray penetration depth from main surface 1$s$ of the crystal substrate while X-ray diffraction conditions of specific parallel crystal lattice planes 1$d$ are satisfied, an irregular distortion at surface layer 1$p$ of the crystal substrate represented by a value of $|v_1-v_2|$ obtained from a half value width $v_1$ of a diffraction intensity peak at the X-ray penetration depth of 0.3 μm and a half value width $v_2$ of the diffraction intensity peak at the X-ray penetration depth of 5 μm is equal to or lower than 130 arcsec, and main surface 1$s$ has a plane orientation inclined in the <10-10> direction at an angle equal to or greater than 10° and equal to or smaller than 80° with respect to one of the (0001) and (000-1) planes 1$c$ of the crystal substrate.

Owing to the fact that the irregular distortion at surface layer 1$p$ of group III nitride crystal substrate 1 according to the present embodiment is equal to or lower than 130 arcsec, and main surface 1$s$ has a plane orientation inclined in the <10-10> direction at inclination angle α equal to or greater than 10° and equal to or smaller than 80° with respect to one of the (0001) and (000-1) planes 1$c$, a blue shift can be suppressed and the integrated intensity of emission can be increased in the light emitting device which is a semiconductor device including at least one semiconductor layer epitaxially grown on main surface 1$s$ of the crystal substrate. From these viewpoints, the irregular distortion at surface layer 1$p$ is preferably equal to or lower than 90 arcsec, and more preferably equal to or lower than 30 arcsec. The irregular distortion at surface layer 1$p$ is preferably as small as possible, and is reduced to 0 arcsec by adjusting processing conditions for the main surface of the crystal substrate in the present invention as will be described later. Inclination angle α of the plane orientation of main surface 1$s$ is preferably equal to or greater than 16° and equal to or smaller than 80°, more preferably equal to or greater than 45° and equal to or smaller than 79°, and further preferably equal to or greater than 63° and equal to or smaller than 79°.

Figure 4:
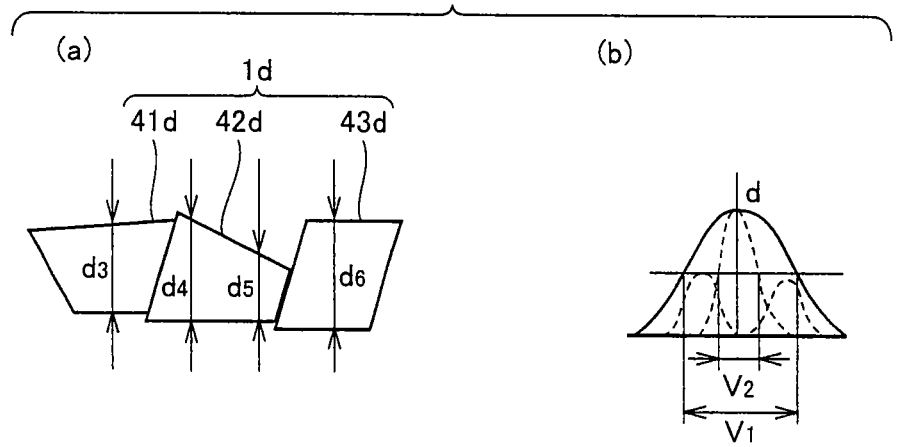
FIG. 4 schematically illustrates a relationship between irregular distortion of a crystal lattice of the group III nitride crystal substrate and a half value width of a diffraction peak on a diffraction profile in the X-ray diffraction method. At (a), the irregular distortion of the crystal lattice is illustrated. At (b), the half value width of the diffraction peak on the diffraction profile is illustrated.
Figure 5:
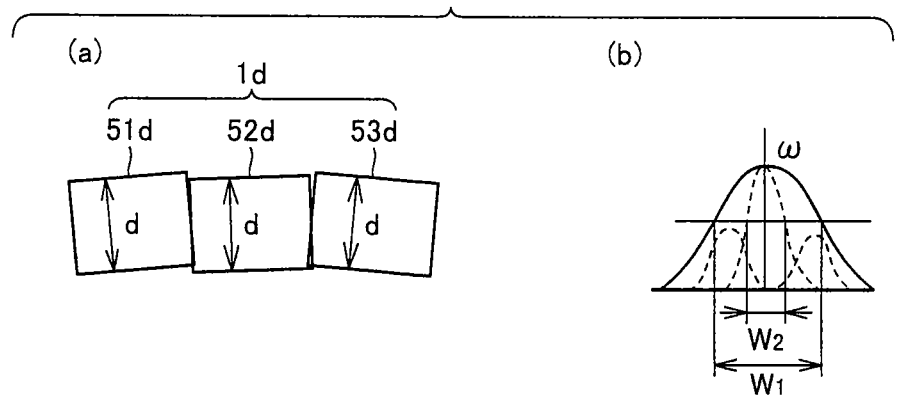
FIG. 5 schematically illustrates a relationship between plane orientation deviation of specific parallel crystal lattice planes of the group III nitride crystal substrate and a half value width on a rocking curve in the X-ray diffraction method. At (a), the plane orientation deviation of the specific parallel crystal lattice planes is illustrated. At (b), the half value width of the diffraction peak on the rocking curve is illustrated.

Referring to FIG. 1, the X-ray penetration depth of 0.3 μm corresponds to a distance from main surface 1$s$ of group III nitride crystal substrate 1 to an inside of surface layer 1$p$, and the X-ray penetration depth of 5 μm corresponds to a distance from main surface 1$s$ of group III nitride crystal substrate 1 to an inside of inner layer 1$r$. Referring to FIG. 4($a$), half value width $v_2$ of the diffraction peak at the X-ray penetration depth of 5 μm can be considered as the half value width of the group III nitride crystal in the original state, but half value width $v_1$ of the diffraction peak at the X-ray penetration depth of 0.3 μm reflects the irregular distortion of the crystal lattice at surface layer 1$p$ due to an influence of surface processing of the crystal substrate (e.g., different plane spacings $d_3$, $d_4$-$d_s$, $d_6$ of the respective crystal lattice planes), and therefore takes a value different from half value width $v_2$ of the diffraction peak at the X-ray penetration depth of 5 μm.

Referring to FIG. 4($b$), half value width $v_1$ of the diffraction peak at the X-ray penetration depth of 0.3 μm and half value width $v_2$ of the diffraction peak at the X-ray penetration depth of 5 μm appear on the diffraction profile relating to arbitrary specific parallel crystal lattice planes 1d of the crystal substrate in the above case. Therefore, the irregular distortion of the surface layer 1p can be expressed by the value of $|v_1-v_2|$ which is a difference between $v_1$ and $v_2$.

(Third Embodiment)

Referring to FIGS. 1, 2, 5 and 6, in group III nitride crystal substrate 1 according to still another embodiment of the present invention, on a rocking curve measured by varying an X-ray penetration depth from main surface 1s of the crystal substrate in connection with X-ray diffraction of arbitrary specific parallel crystal lattice planes 1d (specific parallel crystal lattice planes 1d include specific parallel crystal lattice planes 51d, 52d, 53d of respective crystal lattices; the same applies throughout the present embodiment), a plane orientation deviation of specific parallel crystal lattice planes 1d at surface layer 1p of the crystal substrate represented by a value of $|w_1-w_2|$ obtained from a half value width $w_1$ of a diffraction intensity peak at the X-ray penetration depth of 0.3 μm and a half value width $w_2$ of the diffraction intensity peak at the X-ray penetration depth of 5 μm is equal to or lower than 350 arcsec, and main surface is has a plane orientation inclined in the <10-10> direction at an angle equal to or greater than 10° and equal to or smaller than 80° with respect to one of the (0001) and (000-1) planes 1c of the crystal substrate.

Owing to the fact that, in group III nitride crystal substrate 1 according to the present embodiment, the plane orientation deviation of the specific parallel crystal lattice planes at surface layer 1p is equal to or lower than 350 arcsec, and main surface 1s has a plane orientation inclined in the <10-10> direction at inclination angle α equal to or greater than 10° and equal to or smaller than 80° with respect to one of the (0001) and (000-1) planes 1c, a blue shift can be suppressed and the integrated intensity of emission can be increased in the light emitting device which is a semiconductor device including at least one semiconductor layer epitaxially grown on main surface 1s of the crystal substrate. From these viewpoints, the plane orientation deviation of the specific parallel crystal lattice planes at surface layer 1p is preferably equal to or lower than 190 arcsec, and more preferably equal to or lower than 50 arcsec. The plane orientation deviation of the specific parallel crystal lattice planes at surface layer 1p is preferably as small as possible, and is reduced to 0 arcsec by adjusting processing conditions of the main surface of the crystal substrate in the present invention as will be described later. Inclination angle α of the plane orientation of main surface 1s is preferably equal to or greater than 16° and equal to or smaller than 80°, more preferably equal to or greater than 45° and equal to or smaller than 79°, and further preferably equal to or greater than 63° and equal to or smaller than 79°.

Referring to FIG. 1, the X-ray penetration depth of 0.3 μm corresponds to a distance from main surface 1s of group III nitride crystal substrate 1 to an inside of surface layer 1p, and the X-ray penetration depth of 5 μm corresponds to a distance from main surface 1s of group III nitride crystal substrate 1 to an inside of inner layer 1r. Referring to FIG. 5(a), half value width $w_2$ at the X-ray penetration depth of 5 μm can be considered as the half value width of the group III nitride crystal in the original state, but half value width $w_1$ at the X-ray penetration depth of 0.3 μm reflects the plane orientation deviation of specific parallel crystal lattice planes 1d of the crystal lattice at the surface layer 1p due to an influence of surface processing of the crystal substrate (e.g., different plane orientations of respective specific parallel crystal lattice planes 51d, 52d and 53d of respective crystal lattices), and therefore takes a value different from half value width $w_2$ at the X-ray penetration depth of 5 μm.

Referring to FIG. 5(b), half value width $w_1$ at the X-ray penetration depth of 0.3 μm and half value width $w_2$ at the X-ray penetration depth of 5 μm appear on the rocking curve relating to the arbitrary specific parallel crystal lattice planes of the crystal in the above case. Therefore, the plane orientation deviation of the specific parallel crystal lattice planes of the crystal surface layer can be expressed by the value of $|w_1-w_2|$ which is a difference between $w_1$ and $w_2$.

In group III nitride crystal substrate 1 of the first to third embodiments already described, main surface is preferably has a surface roughness Ry of 30 nm or lower. Surface roughness Ry represents the maximum height Ry defined in JIS B 0601-1994, and more specifically, it is a sum of a height from an average plane of a sampling portion to the highest peak thereof and a depth from the average plane to the lowest bottom thereof, and this sampling portion is extracted from a roughness curved plane as a reference area measuring 10 μm per side (i.e., 10 μm×10 μm=100 μm$^2$; the same applies throughout the present specification) in a direction of its average plane. Owing to the fact that the main surface of the group III nitride crystal substrate has a surface roughness Ry of 30 nm or lower, the semiconductor layer of good crystallinity having a low dislocation density can be epitaxially grown on the main surface of the group III nitride crystal substrate, and the semiconductor device of good characteristics, such as a light emitting device having a high integrated intensity of emission, can be produced. From these viewpoints, the main surface of the group III nitride crystal substrate more preferably has a surface roughness Ry of 10 nm or lower. Surface roughness Ry can be measured by AFM (atomic force microscope), an optical interference-type roughness meter, or the like.

In group III nitride crystal substrate 1 of the first to third embodiments already described, main surface 1s preferably has a surface roughness Ra of 3 nm or lower. Surface roughness Ra represents an arithmetic mean roughness Ra defined in JIS B 0601-1994, and more specifically, it is a value obtained by averaging, with a reference area, a sum of absolute values of deviations (i.e., distances) from an average plane of a sampling portion to a measurement curved surface, and this sampling portion is extracted from a roughness curved plane as a reference area measuring 10 μm per side in a direction of the average plane. Owing to the fact that the main surface of the group III nitride crystal substrate has surface roughness Ra of 3 nm or lower, the semiconductor layer of good crystallinity having a low dislocation density can be epitaxially grown on the main surface of the group III nitride crystal substrate, and the semiconductor device of good characteristics, such as a light emitting device having a high integrated intensity of emission, can be produced. From these viewpoints, the main surface of the group III nitride crystal substrate more preferably has a surface roughness Ra of 1 nm or lower. Surface roughness Ra can be measured by AFM (atomic force microscope), an optical interference-type roughness meter, or the like.

Referring to FIGS. 7 to 10, in group III nitride crystal substrate 1 of the first to third embodiments already described, main surface 1s preferably has a plane orientation inclined at inclination angle β falling within ±4° with respect to any of the {20-21}, {10-11}, {20-2-1}, and {10-1-1} planes of the crystal substrate.

When inclination angle β has an absolute value of less than 0.1° so that main surface 1s has a plane orientation substantially parallel to any of the {20-21}, {10-11}, {20-2-1}, and {10-1-1} planes of the crystal substrate, the concentration of In (indium) introduced into a well layer of the light emitting layer included in at least one semiconductor layer epitaxially grown on main surface $1s$ can be increased. This allows the growth of a desired composition without decreasing the growth temperature, so that the crystallinity of the well layer can be improved. In the light emitting device which is a semiconductor device, reducing a half value width of an emission peak appearing in an emission spectrum owing to the improved crystallinity of the well layer provides favorable emission characteristics. Favorable characteristics can be obtained particularly with the {20-21} planes among the aforementioned plane orientations.

When the plane orientation of main surface $1s$ has inclination angle β of an absolute value equal to or more than 0.1° and equal to or less than 4° with respect to any of the {20-21}, {10-11}, {20-2-1}, and {10-1-1} planes of the crystal substrate, a semiconductor device can be obtained which exhibits favorable emission characteristics approximately similar to those in the case where inclination angle β has an absolute value less than 0.1° so that main surface is has a plane orientation substantially parallel to any of the {20-21}, {10-11}, {20-2-1}, and {10-1-1} planes. Since the morphology of the semiconductor layer grown (including the light emitting layer) is improved when the plane orientation of main surface $1s$ has inclination angle β of an absolute value equal to or more than 0.1° and equal to or less than 4° with respect to any of the {20-21}, {10-11}, {20-2-1}, and {10-1-1} planes of the crystal substrate, the light emitting device (semiconductor device) obtained exhibits favorable emission characteristics. Favorable characteristics can be obtained particularly with the {20-21} planes among the aforementioned plane orientations.

Referring to FIG. 1, in group III nitride crystal substrate 1 of the first to third embodiments already described, oxygen present at main surface $1s$ preferably has an oxygen concentration equal to or more than 2 at. % and equal to or less than 16 at. %. Oxygen present at main surface $1s$ includes oxygen entered due to oxidization of main surface $1s$, oxygen adhered to main surface $1s$, and the like. When oxygen present at main surface $1s$ of group III nitride crystal substrate 1 has an oxygen concentration less than 2 at. %, the interface between the crystal substrate in the semiconductor device obtained and the semiconductor layer epitaxially grown on that crystal substrate will increase in resistance, resulting in reduced integrated intensity of emission. When oxygen present at main surface is of group III nitride crystal substrate 1 has an oxygen concentration more than 16 at. %, the semiconductor layer epitaxially grown on the main surface of the crystal substrate is degraded in crystallinity, resulting in reduced integrated intensity of emission. From these viewpoints, oxygen present at main surface is more preferably has a concentration equal to or more than 3 at. % and equal to or less than 10 at. %. The concentration of oxygen present at the main surface is measured by AES (auger electron spectroscopy), XPS (X-ray photoelectron spectroscopy), or the like.

Owing to the fact that the measurement can be performed by AES and XPS as described above, oxygen present at main surface $1s$ in the present invention includes oxygen adhered to main surface $1s$, oxygen entered main surface $1s$ due to oxidization of the crystal substrate or the like, and oxygen entered a region at a depth reaching generally about 5 nm, at most 10 nm, below the main surface.

Referring to FIG. 1, in group III nitride crystal substrate 1 of the first to third embodiments already described, the dislocation density at the main surface is preferably equal to or less than $1\times10^7$ cm$^{-2}$. When the dislocation density at main surface $1s$ is more than $1\times10^7$ cm$^{-2}$, the semiconductor layer epitaxially grown on the main surface of the crystal substrate is degraded in crystallinity, and therefore, the integrated intensity of emission is reduced. From such viewpoints, the dislocation density at main surface $1s$ is more preferably equal to or less than $1\times10^6$ cm$^{-2}$, and further more preferably equal to or less than $1\times10^5$ cm$^{-2}$. From the viewpoints of the production cost and productivity, the dislocation density at main surface is preferably equal to or more than $1\times10^2$ cm$^{-2}$.

From the viewpoint of reducing the cost and increasing the efficiency in manufacturing the semiconductor device, the group III nitride crystal substrate preferably has a diameter equal to or more than 40 mm, and more preferably equal to or more than 50 mm. When the substrate has a large diameter, the number of devices that can be manufactured from a single substrate increases. To manufacture a large-diameter substrate, a large-diameter underlying substrate is used, and thick crystals are grown, and cut at a desired angle for processing. Alternatively, a plurality of small-diameter group III nitride crystal substrates may be arranged with their side faces being adjacent to each other, and when grown on the main surfaces of the plurality of substrates, respective group III nitride crystals are bound to one another to form a single crystal. The single group III nitride crystal obtained can be processed on to form a large-diameter group III nitride crystal substrate.

From the viewpoint of achieving an improved geometric accuracy such as reducing warpage and thickness variations, the group III nitride crystal substrate preferably has a diameter equal to or less than 150 mm, and more preferably equal to or less than 100 mm.

The main surface of the group III nitride crystal substrate is not limited to a circular shape as long as it has an enough size for producing a device, and may be polygonal such as quadrangular. In the case where the main surface has a polygonal shape, the shortest side preferably has a length equal to or more than 5 mm, and more preferably equal to or more than 10 mm, from the viewpoint of reducing the cost and increasing the efficiency in manufacturing semiconductor devices. From the viewpoint of achieving an improved geometric accuracy such as reducing warpage and thickness variations, the longest side preferably has a length equal to or less than 150 mm, and more preferably equal to or less than 100 mm. A group III nitride crystal substrate whose main surface is quadrangular with its all corners forming the right angle, such as rectangle or square, includes substrates having a main surface of, for example, 5 mm×15 mm, 10 mm×10 mm, 10 mm×20 mm, 18 mm×18 mm, 20 mm×20 mm, 30 mm×50 mm, and the like.

Impurities (dopants) added to the group III nitride crystal substrate are not particularly restricted, but are preferably implemented by the following impurities from the viewpoint of manufacturing a conductive substrate or insulative substrate. For an n-type conductive substrate having a specific resistance equal to or more than $5\times10^{-5}$Ω·cm and equal to or less than 0.5Ω·cm (preferably equal to or more than $5\times10^{-4}$Ω·cm and equal to or less than 0.05Ω·cm) and a carrier concentration equal to or more than $1\times10^{16}$ cm$^{-3}$ and equal to or less than $1\times10^{20}$ cm$^{-3}$ (preferably equal to or more than $1\times10^{17}$ cm$^{-3}$ and equal to or less than $1\times10^{19}$ cm$^{-3}$), O and Si are preferable impurities added to the substrate from the viewpoint of attaining a desired conductivity within such ranges while maintaining crystallinity. For an insulative substrate having a specific resistance equal to or more than $1\times10^4$Ω·cm and equal to or less than $1\times10^{11}$Ω·cm (preferably equal to or more than $1\times10^6$Ω·cm and equal to or less than $1\times10^{10}$Ω·cm), C and Fe are preferable as impurities added to the substrate from the viewpoint of attaining a desired conductivity within such ranges while maintaining crystallinity.

The specific resistance of the substrate can be measured by a four-probe method, a two-probe method, or the like. The carrier concentration of the substrate can be measured by a Hall measurement method, a C-V measurement method, or the like.

[Method of Manufacturing Group III Nitride Crystal Substrate]

The method of manufacturing group III nitride crystal substrate of the first to third embodiments already described is not particularly restricted, but may include the steps of, for example: growing a group III nitride crystal substance; cutting the group III nitride crystal substance at a plurality of planes parallel to planes inclined in the <10-10> direction at inclination angle α equal to or greater than 10° and equal to or smaller than 80° with respect to one of the (0001) and (000-1) planes of the crystal substance, thereby providing a group III nitride crystal substrate having a main surface inclined in the <10-10> direction at inclination angle α equal to or greater than 10° and equal to or smaller than 80° with respect to one of the (0001) and (000-1) planes; and processing on the main surface of the group III nitride crystal substrate.

(Step of Manufacturing Group III Nitride Crystal Substance)

The method of manufacturing the group III nitride crystal substance is not particularly restricted, but a vapor phase growth method such as a HVPE (hydride vapor phase epitaxy) method or a sublimation method, a liquid phase growth method such as a flux method or an ammonothermal method or the like may be suitably used. For example, the HVPE method, flux method, ammonothermal method or the like is suitably used in manufacturing a GaN crystal substance, while the HVPE method, sublimation method, or the like is suitably used in manufacturing an MN crystal substance. The HVPE method or the like is suitably used in manufacturing an InN crystal substance, an AlGaN crystal substance and an InGaN crystal substance.

In manufacturing the above-described group III nitride crystal substance, an underlying substrate is not particularly restricted, but is suitably implemented by a GaAs substrate, a sapphire substrate, an SiC substrate or the like from the viewpoint of reducing a crystal lattice mismatch with the group III nitride crystal substance and improving the crystallinity of the group III nitride crystal substance.

(Step of Forming Group III Nitride Crystal Substrate)

The method of cutting the group III nitride crystal substance manufactured as described above at a plurality of planes parallel to planes inclined in the <10-10> direction at inclination angle α equal to or greater than 10° and equal to or smaller than 80° with respect to one of the (0001) and (000-1) planes of the crystal substance is not particularly restricted, and various cutting methods such as a wire-saw, an inner cutting edge, a peripheral cutting edge, laser machining, discharge machining, and water jet can be used.

(Step of Processing on Main Surface of Group III Nitride Crystal Substrate)

The method of smoothing the main surface of the group III nitride crystal substrate obtained as described above to reduce a process-induced degradation layer is not particularly restricted, but from the viewpoint of reducing both the surface roughness and process-induced degradation layer, CMP (chemical mechanical polishing) is preferably performed after mechanical machining of either grinding or mechanical polishing. It is not necessary to remove completely the process-induced degradation layer from the group III nitride crystal substrate, and the surface layer can be improved in quality by annealing processing before the epitaxial growth of the semiconductor layer. The annealing before the growth of the semiconductor layer causes rearrangement of crystals at the surface layer of the crystal substrate, and allows the epitaxial growth of the semiconductor layer of good crystallinity.

The CMP suitable for efficiently reducing both the process-induced degradation layer and surface roughness of the main surface of the group III nitride crystal substrate having a plane orientation inclined in the <10-10> direction at an angle equal to or greater than 10° and equal to or smaller than 80° with respect to one of the (0001) and (000-1) planes will now be described.

It is preferable that a value X of pH and a value Y (mV) of an oxidation-reduction potential in a slurry used in the CMP satisfy both the following equations (2) and (3):

$$Y \geq -50X + 1300 \quad (2)$$

$$Y \leq -50X + 1900 \quad (3)$$

In the case of $Y < -50X + 1300$, a polishing speed becomes low to increase a mechanical load during the CMP so that the surface quality of the group III nitride crystal substrate is degraded. In the case of $Y > -50x + 1900$, a polishing pad and a polishing device are subjected to a large corrosion effect so that stable polishing becomes difficult.

From the viewpoint of further improving the polishing speed to improve the surface quality of the group III nitride crystal substrate, it is further preferable to satisfy additionally the following equation (4):

$$Y \geq -50X + 1400 \quad (4)$$

The slurry of the CMP usually contains an acid such as hydrochloric acid, sulfuric acid or nitric acid, and/or an alkali such as KOH or NaOH that are added thereto. However, the effect of oxidizing the surface of the chemically stable gallium nitride is small when such acid and/or alkali are used alone. Accordingly, it is preferable to increase the oxidation-reduction potential by adding an oxidizer so that the relationships of the foregoing equations (2) and (3), or the foregoing equations (3) and (4) may be satisfied.

The oxidizer added to the slurry of the CMP is not particularly restricted, but is preferably selected from among hypochlorous acid, chlorinated isocyanuric acids such as trichloroisocyanuric acid, chlorinated isocyanurates such as sodium dichloroisocyanurate, permanganates such as potassium permanganate, dichromates such as potassium dichromate, bromates such as potassium bromate, thiosulfates such as sodium thiosulfate, nitric acid, sulfuric acid, hydrochloric acid, hydrogen peroxide solutions and ozone. Each of these oxidizers may be used alone, or two or more of them may be used in combination.

It is preferable that the pH of slurry of the CMP is 6 or lower, or 8 or more. Acidic slurry having a pH of 6 or lower, or basic slurry having a pH of 8 or more is brought into contact with the group III nitride crystal to etch and remove the process-induced degradation layer of the group III nitride crystal so that the polishing speed can be increased. From such viewpoint, it is more preferable that the pH of slurry is 4 or lower, or 10 or higher.

The acid and base used for controlling the pH of slurry are not particularly restricted, and may be selected, e.g., from among inorganic acids such as hydrochloric acid, nitric acid, sulfuric acid and phosphoric acid, organic acids such as formic acid, acetic acid, oxalic acid, citric acid, malic acid, tartaric acid, succinic acid, phthalic acid and fumaric acid, bases such as KOH, NaOH, $NH_4OH$ and amine, and salts such as sulfate, carbonate and phosphate. Also, the pH can be controlled by addition of the above oxidizer.

The slurry of the CMP preferably contains abrasive grains. These abrasive grains can further increase the polishing speed. The abrasive grains contained in the slurry are not particularly restricted, and may be soft abrasive grains having a lower hardness than the group III nitride crystal substrate. The use of soft abrasive grains allows reduction of the surface roughness of the main surface and the process-induced degradation layer of the crystal substrate.

The soft abrasive grains are not particularly restricted as long as they have a hardness equal to or lower than that of the group III nitride crystal to be polished, but preferably contains at least one material selected from the group consisting of $SiO_2$, $CeO_2$, $TiO_2$, $MgO$, $MnO_2$, $Fe_2O_3$, $Fe_3O_4$, $NiO$, $ZnO$, $CoO$, $Co_3O_4$, $CuO$, $Cu_2O$, $GeO_2$, $CaO$, $Ga_2O_3$, and $In_2O_3$.

The abrasive grains are not restricted to oxides containing a single metallic element, and may be oxides containing two or more kinds of metallic elements (such as those having a structure of ferrite, perovskite, spinel, ilmenite or the like). Alternatively, nitrides such as MN, GaN and InN, carbonates such as $CaCO_3$ and $BaCO_3$, metals such as Fe, Cu, Ti and Ni, or carbon (specifically, carbon black, carbon nanotube, C60 or the like) may be used.

From the viewpoint of reducing surface roughness Ra and surface roughness Ry in a short while without creating any scratch on the main surface of the group III nitride crystal substrate, the abrasive grains are preferably implemented by secondary grains in which the primary grains have been combined. The ratio of average grain diameter $D_2$ of the secondary grains to average grain diameter $D_1$ of the primary grains (ratio of $D_2/D_1$) is preferably equal to or more than 1.6. Average grain diameter $D_2$ of the secondary grains is preferably equal to or more than 200 nm. The secondary grains preferably have a shape of at least one of cocoon, agglomeration and chain. The secondary grains are preferably implemented by $SiO_2$ abrasive grains of fumed silica or colloidal silica in which primary grains have been chemically combined into the secondary grains. The grain diameter of the primary grains can be evaluated from an adsorption specific surface area by gas adsorption, and the secondary grains can be evaluated by dynamic light scattering.

From the viewpoint of reducing the uniform distortion, irregular distortion and plane orientation deviation of the surface layer of the group III nitride crystal substrate, a contact coefficient C (in $10^{-6}$ m) in CMP is preferably equal to or greater than $1.0 \times 10^{-6}$ m and equal to or smaller than $2.0 \times 10^{-6}$ m, and more preferably equal to or greater than $1.2 \times 10^{-6}$ m and equal to or smaller than $1.8 \times 10^{-6}$ m. Contact coefficient C is expressed by the following expression (5) using a slurry viscosity η (in mPa·s), a circumferential velocity V (in m/s) in CMP, and a pressure P (in kPa) in CMP:

$$C = \eta \times V/P \quad (5)$$

In the case where contact coefficient C of the slurry is smaller than $1.0 \times 10^{-6}$ m, a load imposed on the group III nitride crystal substrate in CMP increases so that the uniform distortion, irregular distortion and/or plane orientation deviation of the surface layer of the group III nitride crystal substrate increase. In the case where contact coefficient C of the slurry is greater than $2.0 \times 10^{-6}$ m, the polishing speed decreases so that the surface roughness of the main surface of the group III nitride crystal substrate, the uniform distortion, irregular distortion and/or plane orientation deviation of the surface layer increase. The viscosity of the slurry can be measured by a Brookfield viscometer, an Ostwald viscometer, or the like.

The group III nitride crystal substrate of the first to third embodiments can be manufactured further by growing another group III nitride crystal on main surface 1s of one or more group III nitride crystal substrates 1 of the first to third embodiments obtained as described above, cutting the grown group III nitride crystal at a plane parallel to main surface 1s of the crystal substrate to produce a group III nitride crystal substrate, and subjecting the main surface of the group III nitride crystal substrate to surface processing similarly to the above. A group III nitride crystal substrate used as an underlying substrate for this further growth (repetitive growth) of the group III nitride crystal is not necessarily one crystal substrate, but may be implemented by a plurality of small-size crystal substrates. They can be bound together in the repetitive growth into a single crystal. A crystal substrate cut from the group III nitride crystal bound in the repetitive growth can be used as an underlying substrate for performing the repetitive growth again. Such repeated use of the group III nitride crystal can reduce the production cost.

The method of further growing the group III nitride crystal on main surface 1s of group III nitride crystal substrate 1 of the first to third embodiments is not particularly restricted, and a vapor phase growth method such as the HVPE method or the sublimation method, a liquid phase growth method such as the flux method or the ammonothermal method, or the like may be suitably used. For example, the HVPE method, flux method, ammonothermal method or the like is suitably used in manufacturing a GaN crystal substance, while the HVPE method, sublimation method or the like is suitably used in manufacturing an MN crystal substance. The HVPE method or the like is suitably used in manufacturing an InN crystal substance, an AlGaN crystal substance and an InGaN crystal substance.

[Epilayer-containing Group III Nitride Crystal Substrate]
(Fourth Embodiment)

Referring to FIG. 11, an embodiment of the epilayer-containing group III nitride crystal substrate according to the present invention includes at least one semiconductor layer 2 epitaxially grown on main surface 1s of group III nitride crystal substrate 1 of the first to third embodiments.

In an epilayer-containing group III nitride crystal substrate 3 according to the present embodiment, since semiconductor layer 2 has been epitaxially grown on main surface 1s of group III nitride crystal substrate 1, a main surface 2s of semiconductor layer 2 has a plane orientation identical to the plane orientation of main surface 1s of group III nitride crystal substrate 1. Since main surface is of group III nitride crystal substrate 1 of the first to third embodiments has a plane orientation inclined in the <10-10> direction at predetermined inclination angle α equal to or greater than 10° and equal to or smaller than 80° with respect to one of the (0001) and (000-1) planes, the plane orientation of main surface 2s of semiconductor layer 2 is inclined in the <10-10> direction at predetermined inclination angle α equal to or greater than 10° and equal to or smaller than 80° with respect to one of the (0001) and (000-1) planes. In this manner, the epilayer-containing group III nitride crystal substrate including semiconductor layer 2 of high crystallinity, with main surface 2s having a plane orientation inclined in the <10-10> direction at predetermined inclination angle α equal to or greater than 10° and equal to or smaller than 80° with respect to one of the (0001) and (000-1) planes, can be obtained.

The method of manufacturing semiconductor layer 2 is not particularly restricted, but from the viewpoint of epitaxially growing a semiconductor layer of high crystallinity, a vapor phase growth method such as MOCVD (metal organic chemical vapor deposition), MBE (molecular beam epitaxy) or the like is preferably used.

[Semiconductor Device]
(Fifth Embodiment)

Referring to FIG. 12, an embodiment of the semiconductor device according to the present invention includes epilayer-containing group III nitride crystal substrate 3 according to the fourth embodiment.

Epilayer-containing group III nitride crystal substrate 3 of the fourth embodiment included in the semiconductor device of the present embodiment includes at least one semiconductor layer 2 epitaxially grown on main surface 1s of group III nitride crystal substrate 1 of the first to third embodiments in which main surface 1s has a plane orientation inclined in the <10-10> direction at predetermined inclination angle α equal to or greater than 10° and equal to or smaller than 80° with respect to one of the (0001) and (000-1) planes. Since semiconductor layer 2 has high crystallinity, with its main surface having a plane orientation inclined in the <10-10> direction at predetermined inclination angle α equal to or greater than 10° and equal to or smaller than 80° with respect to one of the (0001) and (000-1) planes, piezoelectric polarization is suppressed to suppress the quantum-confined Stark effect as well, so that the semiconductor device according to the present embodiment are improved in characteristics. For example, in a light emitting device with a light emitting layer 210 included in the above-described semiconductor layer 2, piezoelectric polarization is suppressed to suppress the quantum-confined Stark effect, which suppresses a blue shift of an emission, and leads to an improved emission intensity. Accordingly, light emitting layer 210 that emits light having a peak wavelength equal to or more than 430 nm and equal to or less than 550 nm with high efficiency can be provided in semiconductor layer 2. In particular, the emission intensity of light in the green region having a wavelength equal to or more than 500 nm and equal to or less than 550 nm is significantly improved.

Referring to FIG. 12, the semiconductor device according to the present embodiment includes epilayer-containing group III nitride crystal substrate 3 of the fourth embodiment. Epilayer-containing group III nitride crystal substrate 3 includes group III nitride crystal substrate 1 of the first to third embodiments in which main surface is has a plane orientation inclined in the <10-10> direction at predetermined inclination angle α equal to or greater than 10° and equal to or smaller than 80° with respect to one of the (0001) and (000-1) planes. Epilayer-containing group III nitride crystal substrate 3 also includes, as at least one semiconductor layer 2, a 1000-nm-thick n-type GaN layer 202, a 1200-nm-thick n-type $In_{x1}Al_{y1}Ga_{1-x1-y1}N$ (0<x1, 0<y1, x1+y1<1) cladding layer 204, a 200-nm-thick n-type GaN guide layer 206, a 65-nm-thick undoped $In_{x2}Ga_{1-x2}N$ (0<x2<1) guide layer 208, light emitting layer 210 having three cycles of MQW (multi-quantum well) structure formed of a 15-nm-thick GaN barrier layer and a 3-nm-thick $In_{x3}Ga_{1-x3}N$ (0<x3<1) well layer, a 65-nm-thick undoped $In_{x4}Ga_{1-x4}N$ (0<x4<1) guide layer 222, a 20-nm-thick p-type $Al_{x5}Ga_{1-x5}N$ (0<x5<1) block layer 224, a 200-nm-thick p-type GaN layer 226, a 400-nm-thick p-type $In_{x6}Al_{y6}Ga_{1-x6-y6}N$ (0<x6, 0<y6, x6+y6<1) cladding layer 228, and a 50-nm-thick p-type GaN contact layer 230, sequentially provided on one main surface 1s of the above-described group III nitride crystal substrate 1. A 300-nm-thick $SiO_2$ insulation layer 300 is partially provided on p-type GaN contact layer 230, and a p-side electrode 400 is provided on an exposed part of p-type GaN contact layer 230 and part of $SiO_2$ insulation layer 300. An n-side electrode 500 is provided on the other main surface of group III nitride crystal substrate 1.

[Method of Manufacturing Semiconductor Device]

Referring to FIG. 12, an embodiment of the method of manufacturing the semiconductor device according to the present invention includes the steps of preparing the group III nitride crystal substrate of the first to third embodiments, and growing at least one semiconductor layer 2 on main surface 1s of the crystal to form the epilayer-containing group III nitride crystal substrate. Such manufacturing method provides a semiconductor device having favorable characteristics with the quantum-confined Stark effect due to piezoelectric polarization in the semiconductor layer suppressed. For example, by including light emitting layer 210 in the above-described semiconductor layer 2, the quantum-confined Stark effect due to piezoelectric polarization in light emitting layer 210 is suppressed so that a light emitting device can be obtained with a blue shift of the emission suppressed, and having a high integrated intensity of the emission.

Referring to FIG. 12, the method of manufacturing semiconductor device 4 of the present embodiment is, specifically, started with preparation of group III nitride crystal substrate 1 of the first to third embodiments. Preparation of such group III nitride crystal substrate 1 has been described in [Group III Nitride Crystal Substrate] and [Method of Manufacturing Group III Nitride Crystal Substrate], which will not be repeated.

Then, at least one semiconductor layer 2 is grown on main surface 1s of prepared group III nitride crystal substrate 1 to form epilayer-containing group III nitride crystal substrate 3. The method of growing semiconductor layer 2 is not particularly restricted, but from the viewpoint of epitaxially growing a semiconductor layer of high crystallinity, a vapor phase growth method such as MOCVD (metal organic chemical vapor deposition), MBE (molecular beam epitaxy) or the like is preferably used.

For example, 1000-nm-thick n-type GaN layer 202, 1200-nm-thick n-type $In_{x1}Al_{y1}Ga_{1-x1-y1}N$ cladding layer 204, 200-nm-thick n-type GaN guide layer 206, 65-nm-thick undoped $In_{x2}Ga_{1-x2}N$ guide layer 208, light emitting layer 210 having three cycles of MQW (multi-quantum well) structure formed of a 15-nm-thick GaN barrier layer and a 3-nm-thick $In_{x3}Ga_{1-x3}N$ well layer, 65-nm-thick undoped $In_{x4}Ga_{1-x4}N$ guide layer 222, 20-nm-thick p-type $Al_{x5}Ga_{1-x5}N$ block layer 224, 200-nm-thick p-type GaN layer 226, 400-nm-thick p-type $In_{x6}Al_{y6}Ga_{1-x6-y6}N$ cladding layer 228, and 50-nm-thick p-type GaN contact layer 230 are sequentially grown as at least one semiconductor layer 2 on one main surface 1s of group III nitride crystal substrate 1 by MOCVD, for example.

Then, 300-nm-thick $SiO_2$ insulation layer 300 is provided on p-type GaN contact layer 230 by a deposition method. Subsequently, 10-μm-wide stripe windows are formed by photolithography and wet etching. Laser stripes are provided in parallel to a direction which is a projection of the <10-10> direction axis on the main surface of the semiconductor layer. An Ni/Au electrode is then provided as p-side electrode 400 on these stripe windows and on part of $SiO_2$ insulation layer 300 by a deposition method. A Ti/Al/Ti/Au electrode is provided as n-side electrode 500 on the other main surface of the group III nitride crystal substrate by a deposition method.

EXAMPLES

First Example

1. Manufacture of Group III Nitride Crystal Substance

A 50-mm-thick GaN crystal substance (group III nitride crystal substance) was grown by the HYPE method using a 50-mm-diameter GaAs crystal substrate as an underlying substrate. More specifically, a boat holding metal Ga was heated to 800° C. in an HVPE reactor under an atmospheric pressure, and a mixed gas of an HCl gas and a carrier gas ($H_2$ gas) was introduced into this boat to cause a reaction between the metal Ga and HCl gas, thereby producing a GaCl gas. Simultaneously, a mixed gas of an $NH_3$ gas and a carrier gas ($H_2$ gas) was introduced into the HYPE reactor to cause a reaction between the GaCl gas and $NH_3$ gas, thereby growing a GaN crystal substance on the GaAs crystal substrate (underlying substrate) placed in the HYPE reactor. The growth temperature of the GaN crystal substance was 1050 C.°, the HCl gas in the HVPE reactor had a partial pressure of 2 kPa, and the $NH_3$ gas had a partial pressure of 30 kPa.

2. Manufacture of Group III Nitride Crystal Substrate

The GaN crystal substance (group III nitride crystal substance) thus obtained was sliced at planes parallel to a plane having inclination angle α ranging from 10° to 90° in the [10-10] direction with respect to the (0001) planes, thereby manufacturing a GaN crystal substrate (group III nitride crystal substrate) with a main surface having each of plane orientations as shown in FIG. 1.

3. Surface Processing of Group III Nitride Crystal Substrate

The main surface of the GaN crystal substrate (group III nitride crystal substrate) thus obtained was subjected to lapping (mechanical polishing), and then to CMP (chemical mechanical polishing) to obtain a GaN crystal substrate for a semiconductor device. Three kinds of diamond abrasive grains having a grain diameter of 2 μm, 3 μm and 9 μm were prepared, and lapping was performed while reducing the grain diameter of the diamond abrasive grains in a stepwise fashion using a copper surface plate or tin surface plate. The lapping pressure ranged from 100 $gf/cm^2$ to 500 $gf/cm^2$ (9.8 kPa to 49.0 kPa), and the number of rotations of the GaN crystal substrate and the surface plate ranged from 30 rotations/min to 60 rotations/min. CMP was performed with contact coefficient C adjusted to have values shown in Table 1, using slurry containing colloidal silica as abrasive grains in which primary grains had been chemically combined into secondary grains (the primary grains having a diameter of 70 nm, and the secondary grains having a diameter of 190 nm) as well as containing nitric acid as a pH controlling agent and trichloroisocyanuric acid as an oxidizer, with the pH and oxidation-reduction potential (ORP) prepared to have values shown in Table 1.

For the GaN crystal substrate undergone the surface processing, a diffracted X-ray from the (10-13) planes (specific parallel crystal lattice planes in this measurement) was measured while changing the X-ray penetration depth from 0.3 μm to 5 μm, and thereby to obtain a plane spacing of the (10-13) planes and a half value width of a diffraction intensity peak on a diffraction profile as well as a half value width of a diffraction intensity peak on a rocking curve. From these values, the uniform distortion and irregular distortion at the surface layer of the GaN crystal substrate as well as the plane orientation deviation of the crystal lattice planes were evaluated. For the X-ray diffraction measurement, an X-ray wavelength of $CuK_{\alpha 1}$ in a parallel optical system was used. The X-ray penetration depth was controlled by changing at least one of X-ray incident angle ω to the crystal surface, inclination angle χ of the crystal surface and rotation angle φ within the crystal surface. From the viewpoint of facilitating the evaluation by the X-ray diffraction at the above-mentioned X-ray penetration depths, the specific parallel crystal lattice planes were implemented by the (10-11) planes in Examples I-6, I-7, I-13 and I-14, while the specific parallel crystal lattice planes were implemented by the (10-1-3) planes in Examples I-15 and I-16.

Another GaN crystal substrate obtained by a manufacturing method and a surface processing method similar to those in the present embodiment had a specific resistance of 1× $10^{-2}$ Ω·cm when measured by the four-probe method, and a carrier concentration of $2 \times 10^{18}$ $cm^{-3}$ when measured by the Hall measurement method.

4. Manufacture of Semiconductor Device

Referring to FIG. 12, as at least one semiconductor layer 2, 1000-nm-thick n-type GaN layer 202, 1200-nm-thick n-type $In_{x1}Al_{y1}Ga_{1-x1-y1}N$ (x1=0.03, y1=0.14) cladding layer 204, 200-nm-thick n-type GaN guide layer 206, 65-nm-thick undoped $In_{x2}Ga_{1-x2}N$ (x2=0.03) guide layer 208, light emitting layer 210 having three cycles of MQW (multi-quantum well) structure formed of a 15-nm-thick GaN barrier layer and a 3-nm-thick $In_{x3}Ga_{1-x3}N$ (x3=0.2 to 0.3) well layer, 65-nm-thick undoped $In_{x4}Ga_{1-x4}N$ (x4=0.03) guide layer 222, 20-nm-thick p-type $Al_{x5}Ga_{1-x5}N$ (x5=0.11) block layer 224, 200-nm-thick p-type GaN layer 226, 400-nm-thick p-type $In_{x6}Al_{y6}Ga_{1-x6-y6}N$ (x6=0.03, y6=0.14) cladding layer 228, and 50-nm-thick p-type GaN contact layer 230 are sequentially grown by MOCVD on one main surface 1s of a GaN crystal substrate (group III nitride crystal substrate 1) for the semiconductor device obtained as described above.

Then, 300-nm-thick $SiO_2$ insulation layer 300 was provided on p-type GaN contact layer 230 by a deposition method. Subsequently, 10-μm-wide stripe windows were formed by photolithography and wet etching. Laser stripes were provided in parallel to a direction which is a projection of the <0001> direction axis on the main surface of the semiconductor layer. An Ni/Au electrode was then provided as p-side electrode 400 on these stripe windows and on part of $SiO_2$ insulation layer 300 by a deposition method. The other main surface of the GaN crystal substrate (group III nitride crystal substrate 1) was subjected to lapping (mechanical polishing) to provide a mirror surface. At this stage, the cross section of a wafer including the substrate was monitored using a contact-type film thickness meter, or using an optical microscope or SEM (scanning electron microscope) to measure the thickness of each layer in the wafer and the total thickness.

For producing cavity mirrors corresponding to the laser stripes, a laser scriber with a YAG laser having a peak wavelength of 355 nm was used. In the case of breaking using the laser scriber, the lasing chip yield can be improved as compared to the case of using a diamond scriber. Scribed grooves were formed under the conditions that the laser beam power was 100 mW and the scanning speed was 5 mm/s. The scribed grooves as formed had a length of 30 μm, a width of 10 μm and a depth of 40 μm, for example. The scribed grooves were formed by directly irradiating the main surface of the semiconductor layer with laser beams at a pitch of 800 μm through openings of the insulation film of the substrate. The cavity length was 600 μm. Cavity mirrors were produced by cleavage using a blade. Laser bars were produced by applying a pressure on the rear side of the substrate for breakage.

End faces of the laser bars were then coated with a dielectric multilayer film by a vacuum deposition method. The dielectric multilayer film was obtained by stacking $SiO_2$ and $TiO_2$ in alternate cycles. Each film thickness was adjusted to range from 50 nm to 100 nm, and a peak wavelength of reflectance was designed to range from 500 nm to 530 nm. A reflection surface at one of the end faces was obtained in 10 cycles, and a design reflectance was set at about 95%. A reflection surface at the other end face was obtained in 6 cycles, and a design reflectance was set at about 80%.

The semiconductor device obtained as described above was evaluated by applying current at a room temperature (25 C.°) in the following manner. A power source was implemented by a pulsed power source providing a pulse width of 500 ns and a duty ratio of 0.1%, and current was applied by lowering a needle on the surface electrodes. The current density was 100 $A/cm^2$. LED mode light was monitored by placing optical fibers on the main surface side of the laser bars and measuring an emission spectrum emitted from the main surface. Table 1 shows integrated intensities of emission peak in a wavelength ranging from 500 nm to 550 nm of emission spectrum of LED mode light. Table 1 also shows half value widths of emission peak in a wavelength ranging from 500 nm to 550 nm of emission spectrum of LED mode light. Laser beams were monitored by placing optical fibers at the end face side of the laser bars and measuring an emission spectrum emitted from the end face. The emission peak wavelength of LED mode light ranged from 500 nm to 550 nm. The lasing peak wavelength of laser beams ranged from 500 nm to 530 nm.

As can be seen from Table 1, in the group III nitride crystal substrate, when the uniform distortion at the surface layer was equal to or less than $1.9 \times 10^{-3}$, the irregular distortion at the surface layer was equal to or less than 130 arcsec, and/or the plane orientation deviation of the specific parallel crystal lattice planes of the surface layer was equal to or less than 350 arcsec, and the main surface has a plane orientation inclined in the <10-10> direction at an angle equal to or greater than 10° and equal to or smaller than 80° with respect to one of the (0001) and (000-1) planes, then the integrated intensity of emission peak in a wavelength ranging from 500 nm to 550 nm of emission spectrum of LED mode light of the semicon-

TABLE 1

| | EXAMPLE | I-1 | I-2 | I-3 | I-4 | I-5 | I-6 | I-7 | I-8 |
|---|---|---|---|---|---|---|---|---|---|
| CRYSTAL SUBSTRATE | PLANE ORIENTATION OF MAIN SURFACE | (0001) | (0001) | (10-111) | (10-111) | (10-16) | (10-14) | (10-12) | (20-23) |
| | INCLINATION ANGLE α (°) | 0 | 0 | 10 | 10 | 17 | 25 | 43 | 51 |
| CMP CONDITIONS | pH OF SLURRY | 2 | 2 | 2 | 2 | 2 | 2 | 2 | 2 |
| | ORP OF SLURRY (mV) | 900 | 1400 | 900 | 1200 | 1200 | 1200 | 1200 | 1200 |
| | CONTACT COEFFICIENT C ($\times 10^{-6}$ m) | 0.8 | 1.2 | 0.8 | 1.2 | 1.2 | 1.2 | 1.2 | 1.2 |
| CRYSTAL SUBSTRATE | UNIFORM DISTORTION ($\times 10^{-3}$) | 2.3 | 1.9 | 2.2 | 1.9 | 1.9 | 1.8 | 1.9 | 1.9 |
| | IRREGULAR DISTORTION (arcsec) | 170 | 130 | 170 | 130 | 130 | 130 | 130 | 130 |
| | PLANE ORIENTATION DEVIATION (arcsec) | 420 | 350 | 420 | 350 | 350 | 350 | 350 | 350 |
| DEVICE | INTEGRATED INTENSITY OF LED PEAK (a.u.) | 0 | 5 | 2 | 10 | 12 | 14 | 15 | 15 |
| | HALF WIDTH VALUE OF LED PEAK (nm) | — | 60 | — | 54 | 50 | 47 | 46 | 44 |
| | EXAMPLE | I-9 | I-10 | I-11 | I-12 | I-13 | I-14 | I-15 | I-16 |
| CRYSTAL SUBSTRATE | PLANE ORIENTATION OF MAIN SURFACE | (10-11) | (20-21) | (30-31) | (30-31) | (10-10) | (10-10) | (10-1-1) | (20-2-1) |
| | INCLINATION ANGLE α (°) | 62 | 75 | 80 | 80 | 90 | 90 | 62 | 75 |
| CMP CONDITIONS | pH OF SLURRY | 2 | 2 | 2 | 2 | 2 | 2 | 2 | 2 |
| | ORP OF SLURRY (mV) | 1200 | 1200 | 1200 | 900 | 1200 | 900 | 1200 | 1200 |
| | CONTACT COEFFICIENT C ($\times 10^{-6}$ m) | 1.2 | 1.2 | 1.2 | 0.7 | 1.2 | 0.7 | 1.8 | 1.8 |
| CRYSTAL SUBSTRATE | UNIFORM DISTORTION ($\times 10^{-3}$) | 1.9 | 1.8 | 1.9 | 2.3 | 1.9 | 2.2 | 1.9 | 1.9 |
| | IRREGULAR DISTORTION (arcsec) | 130 | 130 | 130 | 170 | 130 | 160 | 130 | 130 |
| | PLANE ORIENTATION DEVIATION (arcsec) | 350 | 350 | 350 | 410 | 350 | 410 | 350 | 350 |
| DEVICE | INTEGRATED INTENSITY OF LED PEAK (a.u.) | 18 | 20 | 15 | 3 | 5 | 0 | 16 | 18 |
| | HALF WIDTH VALUE OF LED PEAK (nm) | 33 | 32 | 38 | — | 55 | — | 34 | 33 | ductor device produced using such crystal substrate increased. When the plane orientation of the main surface was implemented by any of {10-11}, {20-21}, {10-1-1} and {20-2-1}, then the half value width of emission peak in a wavelength ranging from 500 nm to 550 nm of emission spectrum of LED mode light of the semiconductor device produced using such crystal substrate decreased.

In each of Examples I-2 and I-10, a blue shift was evaluated by measuring the emission wavelength of LED mode light Table 2, and with contact coefficient C adjusted to have values shown in Table 2. The uniform distortion and irregular distortion at the surface layer of the GaN crystal substrate undergone surface processing as well as the plane orientation deviation of the crystal lattice planes were evaluated, and the integrated intensity and the half value width of emission peak in a wavelength ranging from 500 nm to 550 nm of emission spectrum of LED mode light of the semiconductor device were measured, similarly to Example 1. The results are shown in Table 2.

TABLE 2

| EXAMPLE | | II-1 | II-2 | II-3 | II-4 | II-5 | II-6 | II-7 | II-8 | II-9 | II-10 | II-11 |
|---|---|---|---|---|---|---|---|---|---|---|---|---|
| CRYSTAL SUBSTRATE | PLANE ORIENTATION OF MAIN SURFACE | (20-21) | (20-21) | (20-21) | (20-21) | (20-21) | (20-21) | (20-21) | (20-21) | (10-11) | (10-11) | (30-31) |
| | INCLINATION ANGLE α (°) | 75 | 75 | 75 | 75 | 75 | 75 | 75 | 75 | 62 | 62 | 80 |
| CMP CONDITIONS | pH OF SLURRY | 3 | 3 | 3 | 3 | 3 | 3 | 3 | 3 | 3 | 3 | 3 |
| | ORP OF SLURRY (mV) | 1650 | 1540 | 1470 | 1380 | 1310 | 1250 | 1200 | 850 | 1400 | 850 | 1500 |
| | CONTACT COEFFICIENT C ($\times 10^{-6}$ m) | 1.8 | 1.6 | 1.5 | 1.4 | 1.3 | 1.1 | 1.0 | 0.9 | 1.5 | 0.9 | 1.5 |
| CRYSTAL SUBSTRATE | UNIFORM DISTORTION ($\times 10^{-3}$) | 0.4 | 0.7 | 1.0 | 1.2 | 1.4 | 1.7 | 1.9 | 2.3 | 1.1 | 2.1 | 0.9 |
| | IRREGULAR DISTORTION (arcsec) | 0 | 30 | 55 | 75 | 90 | 110 | 130 | 160 | 50 | 160 | 35 |
| | PLANE ORIENTATION DEVIATION (arcsec) | 0 | 50 | 80 | 120 | 190 | 260 | 350 | 420 | 60 | 410 | 50 |
| DEVICE | INTEGRATED INTENSITY OF LED PEAK (a.u.) | 30 | 28 | 26 | 25 | 23 | 22 | 18 | 4 | 24 | 4 | 20 |
| | HALF WIDTH VALUE OF LED PEAK (nm) | 30 | 30 | 31 | 30 | 31 | 32 | 32 | 53 | 30 | 54 | 41 | with a current density of 1 A/cm² and 100 A/cm², respectively. The blue shift in Example I-2 was 40 nm, while the blue shift in Example I-10 was 10 nm. In the group III nitride crystal substrate, when the uniform distortion at the surface layer was equal to or less than $1.9\times10^{-3}$, the irregular distortion at the surface layer was equal to or less than 130 arcsec, and/or the plane orientation deviation of the specific parallel crystal lattice planes of the surface layer was equal to or less than 350 arcsec, and the main surface has a plane orientation inclined in the <10-10> direction at an angle equal to or greater than 10° and equal to or smaller than 80° with respect to one of the (0001) and (000-1) planes, a blue shift in the semiconductor device produced using such crystal substrate was extremely small.

Example II

A GaN crystal substrate (group III nitride crystal substrate) and a semiconductor device were manufactured similarly to Example I, except that CMP was performed using slurry containing colloidal silica as abrasive grains in which primary grains had been chemically combined into secondary grains (the primary grains having a diameter of 15 nm, and the secondary grains having a diameter of 40 nm) as well as containing citric acid as a pH controlling agent and trichloroisocyanuric acid as an oxidizer, with the pH and oxidation-reduction potential (ORP) prepared to have values shown in As can be seen from Table 2, in the group III nitride crystal substrate, when the main surface has a plane orientation inclined in the <10-10> direction at an angle equal to or greater than 10° and equal to or smaller than 80° with respect to one of the (0001) and (000-1) planes, the integrated intensity of emission peak in a wavelength ranging from 500 nm to 550 nm of emission spectrum of LED mode light of the semiconductor device produced using such crystal substrate increased as the uniform distortion and irregular distortion at the surface layer as well as the plane orientation deviation of the specific parallel crystal lattice planes decreased.

Example III

A GaN crystal substrate (group III nitride crystal substrate) and a semiconductor device were manufactured similarly to Example I, except that the main surface of the GaN crystal substrate (group III nitride crystal substrate) had the (20-21) plane orientation (inclined at inclination angle α of 75° with respect to the (0001) planes), and except that CMP was performed using slurry containing spherical colloidal silica (having a grain diameter shown in Table 3) as abrasive grains as well as containing sodium carbonate as a pH controlling agent and sodium dichloroisocyanurate as an oxidizer, with the pH and oxidation-reduction potential (ORP) prepared to have values shown in Table 3, and with contact coefficient C adjusted to have values shown in Table 3. The uniform distortion and irregular distortion at the surface layer of the GaN crystal substrate undergone surface processing as well as the plane orientation deviation of the crystal lattice planes were evaluated, and the integrated intensity and the half value width of an emission peak in a wavelength ranging from 500 nm to 550 nm of emission spectrum of LED mode light of the semiconductor device were measured, similarly to Example 1. The results are shown in Table 3.

TABLE 3

| | EXAMPLE | III-1 | III-2 | III-3 | III-4 | III-5 | III-6 |
|---|---|---|---|---|---|---|---|
| CRYSTAL SUBSTRATE | PLANE ORIENTATION OF MAIN SURFACE | (20-21) | (20-21) | (20-21) | (20-21) | (20-21) | (20-21) |
| | INCLINATION ANGLE α (°) | 75 | 75 | 75 | 75 | 75 | 75 |
| CMP CONDITIONS | GRAIN DIAMETER (nm) | 20 | 50 | 80 | 100 | 200 | 400 |
| | pH OF SLURRY | 10 | 10 | 10 | 10 | 10 | 10 |
| | ORP OF SLURRY (mV) | 1000 | 1000 | 1020 | 1020 | 1100 | 1100 |
| | CONTACT COEFFICIENT C ($\times 10^{-6}$ m) | 1.1 | 1.1 | 1.1 | 1.2 | 1.2 | 1.2 |
| CRYSTAL SUBSTRATE | UNIFORM DISTORTION ($\times 10^{-3}$) | 1.2 | 1.2 | 1.2 | 1.2 | 1.2 | 1.2 |
| | IRREGULAR DISTORTION (arcsec) | 40 | 40 | 40 | 40 | 40 | 55 |
| | PLANE ORIENTATION DEVIATION (arcsec) | 70 | 70 | 70 | 70 | 70 | 80 |
| | SURFACE ROUGHNESS Ra (nm) | 0.3 | 0.7 | 1 | 3 | 5 | 7 |
| | SURFACE ROUGHNESS Ry (nm) | 3.1 | 6.5 | 10 | 30 | 54 | 83 |
| DEVICE | INTEGRATED INTENSITY OF LED PEAK (a.u.) | 35 | 34 | 33 | 32 | 30 | 24 |
| | HALF WIDTH VALUE OF LED PEAK (nm) | 30 | 31 | 30 | 31 | 30 | 31 |

As can be seen from Table 3, in the group III nitride crystal substrate, when the uniform distortion at the surface layer was equal to or less than $1.9 \times 10^{-3}$, the irregular distortion at the surface layer was equal to or less than 130 arcsec, and/or the plane orientation deviation of the specific parallel crystal lattice planes of the surface layer was equal to or less than 350 arcsec, and when the main surface has a plane orientation inclined in the <10-10> direction at an angle equal to or greater than 10° and equal to or smaller than 80° with respect to one of the (0001) and (000-1) planes, the integrated intensity of emission peak in a wavelength ranging from 500 nm to 550 nm of emission spectrum of LED mode light of the semiconductor device produced using such crystal substrate increased as surface roughness Ra and surface roughness Ry of the surface layer decreased.

Example IV

A GaN crystal substrate (group III nitride crystal substrate) and a semiconductor device were manufactured similarly to Example I, except that the main surface of the GaN crystal substrate (group III nitride crystal substrate) had the (10-11) plane orientation (inclined at inclination angle α of 62° with respect to the (0001) planes), and except that CMP was performed using slurry containing spherical colloidal silica (having a grain diameter of 40 nm) as abrasive grains as well as containing sulfuric acid as a pH controlling agent, and hydrogen peroxide solution and trichloroisocyanuric acid as an oxidizer, with the pH and oxidation-reduction potential (ORP) prepared to have values shown in Table 4, and with contact coefficient C adjusted to have values shown in Table 4. The uniform distortion and irregular distortion at the surface layer of the GaN crystal substrate undergone surface processing as well as the plane orientation deviation of the crystal lattice planes were evaluated, and the integrated intensity and the half value width of an emission peak in a wavelength ranging from 500 nm to 550 nm of emission spectrum of LED mode light of the semiconductor device were measured. The results are shown in Table 4.

TABLE 4

| | EXAMPLE | IV-1 | IV-2 | IV-3 | IV-4 | IV-5 | IV-6 | IV-7 |
|---|---|---|---|---|---|---|---|---|
| CRYSTAL SUBSTRATE | PLANE ORIENTATION OF MAIN SURFACE | (10-11) | (10-11) | (10-11) | (10-11) | (10-11) | (10-11) | (10-11) |
| | INCLINATION ANGLE α (°) | 62 | 62 | 62 | 62 | 62 | 62 | 62 |
| CMP CONDITIONS | pH OF SLURRY | 4 | 4 | 3 | 3 | 2 | 2 | 0.8 |
| | ORP OF SLURRY (mV) | 1100 | 1200 | 1300 | 1350 | 1500 | 1600 | 1700 |
| | CONTACT COEFFICIENT C ($\times 10^{-6}$ m) | 1.8 | 1.6 | 1.5 | 1.4 | 1.3 | 1.1 | 1.0 |
| CRYSTAL SUBSTRATE | UNIFORM DISTORTION ($\times 10^{-3}$) | 1.1 | 1.1 | 1.1 | 1.1 | 1.1 | 1.1 | 1.1 |
| | IRREGULAR DISTORTION (arcsec) | 60 | 60 | 60 | 60 | 60 | 60 | 60 |
| | PLANE ORIENTATION DEVIATION (arcsec) | 90 | 90 | 90 | 90 | 90 | 90 | 90 |
| | OXYGEN CONCENTRATION (at. %) | 1 | 2 | 3 | 5 | 10 | 16 | 22 |
| DEVICE | INTEGRATED INTENSITY OF LED PEAK (a.u.) | 22 | 34 | 33 | 32 | 30 | 28 | 24 |
| | HALF WIDTH VALUE OF LED PEAK (nm) | 29 | 30 | 30 | 30 | 30 | 30 | 30 |

As can be seen from Table 4, in the group III nitride crystal substrate, when the uniform distortion at the surface layer was equal to or less than $1.9 \times 10^{-3}$, the irregular distortion at the surface layer was equal to or less than 130 arcsec, and/or the plane orientation deviation of the specific parallel crystal lattice planes of the surface layer was equal to or less than 350 arcsec, and the main surface has a plane orientation inclined in the <10-10> direction at an angle equal to or greater than 10° and equal to or smaller than 80° with respect to one of the (0001) and (000-1) planes, the concentration of oxygen present at the main surface was measured by AES (auger electron spectroscopy) to reveal that, when the concentration was equal to or more than 2 at. % and equal to or less than 16 at. %, the integrated intensity of emission peak of LED mode light of the semiconductor device produced using such crystal substrate increased.

Example V

1. Manufacture of Group III Nitride Crystal Substance and Group III Nitride Crystal Substrate In Examples V-1 and V-2, a GaN crystal substance was grown by the flux method implementing the underlying substrate by a GaN crystal substrate (group III nitride crystal substrate) produced in Example I-10 of Example I with the main surface having the plane orientation (20-21). More specifically, the GaN crystal substrate (underlying substrate), metal Ga serving as a Ga material, and metal Na serving as a flux were stored in a crucible such that the ratio of Ga:Na was 1:1 in molar ratio. The crucible was then heated to obtain a Ga—Na melt at 800° C. making contact with the (20-21) main surface of the GaN crystal substrate. An $N_2$ gas of 5 MPa was dissolved as an N material in this Ga—Na melt to grow a 2-mm-thick GaN crystal on the (20-21) main surface of the GaN crystal substrate. As the crystal growth progressed, the dislocation density decreased. The dislocation density of the main surface of the GaN crystal substrate was adjusted depending on the cutting location of the GaN crystal substrate from the GaN crystal (cf. Table 5).

In Examples V-3 to V-6, a 5-mm-thick GaN crystal substance was grown by the HVPE method implementing the underlying substrate by a GaN crystal substrate (group III nitride crystal substrate) produced in Example I-10 of Example I with the main surface having the plane orientation (20-21). The growth conditions of GaN crystal by the HVPE method were similar to those in Example I. As the crystal growth progressed, the dislocation density decreased. The dislocation density of the main surface of the GaN crystal substrate was adjusted depending on the cutting location of the GaN crystal substrate from the GaN crystal (cf. Table 5).

2. Surface Processing of Group III Nitride Crystal Substrate

A GaN crystal substrate for a semiconductor device was obtained by subjecting the GaN crystal substrate (group III nitride crystal substrate) to surface processing similarly to Example I, except that CMP was performed using slurry containing fumed silica as abrasive grains in which primary grains had been chemically combined into secondary grains (the primary grains having a diameter of 20 nm, and the secondary grains having a diameter of 200 nm) as well as containing malic acid as a pH controlling agent and potassium permanganate as an oxidizer, with the pH and oxidation-reduction potential (ORP) prepared to have values shown in Table 5, and with contact coefficient C adjusted to have values shown in Table 5. The uniform distortion and irregular distortion at the surface layer of the GaN crystal substrate (GaN crystal substrate undergone surface processing) for a semiconductor device thus obtained as well as the plane orientation deviation of the crystal lattice planes were evaluated similarly to Example I.

3. Manufacture of Semiconductor Device

A semiconductor device was manufactured similarly to Example I using the GaN crystal substrate for a semiconductor device obtained as described above, and the integrated intensity and the half value width of emission peak in a wavelength ranging from 500 nm to 550 nm of emission spectrum of LED mode light of the semiconductor device were measured. The results are shown in Table 5.

sion peak in a wavelength ranging from 500 nm to 550 nm of emission spectrum of LED mode light of the semiconductor device produced using such crystal substrate increased as the dislocation density of the main surface of the group III nitride crystal substrate decreased, for example, as the dislocation density dropped to $1\times10^7$ cm$^{-2}$ or below, $1\times10^6$ cm$^{-2}$ or below, or even $1\times10^5$ cm$^{-2}$ or below. Results equivalent to the above were also obtained when the underlying substrate was implemented by a plurality of GaN crystal substrates, and a bound single GaN crystal substance was grown on the underlying substrates by the flux method or HVPE method.

Example VI

A GaN crystal substrate (group III nitride crystal substrate) was subjected to surface processing similarly to Example I, except that CMP was performed using slurry containing spherical colloidal silica as abrasive grains in which abrasive grains were not agglomerated (having a grain diameter of 20 nm) as well as containing hydrochloric acid as a pH control-

TABLE 5

| | EXAMPLE | V-1 | V-2 | V-3 | V-4 | V-5 | V-6 |
|---|---|---|---|---|---|---|---|
| CRYSTAL SUBSTRATE | PLANE ORIENTATION OF MAIN SURFACE | (20-21) | (20-21) | (20-21) | (20-21) | (20-21) | (20-21) |
| | INCLINATION ANGLE α (°) | 75 | 75 | 75 | 75 | 75 | 75 |
| CMP CONDITIONS | pH OF SLURRY | 3 | 3 | 3 | 3 | 3 | 3 |
| | ORP OF SLURRY (mV) | 1300 | 1300 | 1300 | 1300 | 1300 | 1300 |
| | CONTACT COEFFICIENT C ($\times 10^{-6}$ m) | 1.4 | 1.4 | 1.4 | 1.5 | 1.5 | 1.5 |
| CRYSTAL SUBSTRATE | UNIFORM DISTORTION ($\times 10^{-3}$) | 1.4 | 1.4 | 1.4 | 1.4 | 1.4 | 1.4 |
| | IRREGULAR DISTORTION (arcsec) | 100 | 100 | 100 | 100 | 100 | 100 |
| | PLANE ORIENTATION DEVIATION (arcsec) | 200 | 200 | 200 | 200 | 200 | 200 |
| | DISLOCATION DENSITY (cm$^{-2}$) | $1 \times 10^2$ | $1 \times 10^3$ | $1 \times 10^4$ | $1 \times 10^5$ | $1 \times 10^6$ | $1 \times 10^7$ |
| DEVICE | INTEGRATED INTENSITY OF LED PEAK (a.u.) | 33 | 33 | 31 | 30 | 28 | 21 |
| | HALF WIDTH VALUE OF LED PEAK (nm) | 30 | 31 | 30 | 31 | 31 | 32 |

As can be seen from Table 5, in the group III nitride crystal substrate, when the uniform distortion at the surface layer was equal to or less than $1.9\times10^{-3}$, the irregular distortion at the surface layer was equal to or less than 130 arcsec, and/or the plane orientation deviation of the specific parallel crystal lattice planes of the surface layer was equal to or less than 350 arcsec, and the main surface has a plane orientation inclined in the <10-10> direction at an angle equal to or greater than 10° and equal to or smaller than 80° with respect to one of the (0001) and (000-1) planes, the integrated intensity of emisling agent, and hydrogen peroxide solutions and trichloroisocyanuric acid as oxidizers, with the pH and oxidation-reduction potential (ORP) prepared to have values shown in Table 6, and with CMP circumferential speed, CMP pressure and contact coefficient C adjusted to have values shown in Table 6. The uniform distortion and irregular distortion at the surface layer of the GaN crystal substrate undergone surface processing as well as the plane orientation deviation of the crystal lattice planes were evaluated similarly to Example I. The results are shown in Table 6.

TABLE 6

| EXAMPLE | | VI-1 | VI-2 | VI-3 | VI-4 | VI-5 | VI-6 | VI-7 |
|---|---|---|---|---|---|---|---|---|
| CRYSTAL SUBSTRATE | PLANE ORIENTATION OF MAIN SURFACE | (10-11) | (10-11) | (10-11) | (10-11) | (10-11) | (10-11) | (10-11) |
| | INCLINATION ANGLE $\alpha$ (°) | 62 | 62 | 62 | 62 | 62 | 62 | 62 |
| CMP CONDITIONS | pH OF SLURRY | 2 | 2 | 2 | 2 | 2 | 2 | 2 |
| | ORP OF SLURRY (mV) | 1000 | 1200 | 1200 | 1500 | 1800 | 1800 | 1900 |
| | CONTACT COEFFICIENT C ($\times 10^{-6}$ m) | 1.0 | 0.3 | 1.0 | 1.5 | 2.0 | 4.0 | 2.0 |
| | VISCOSITY OF SLURRY $\eta$ (mPa·s) | 10 | 10 | 10 | 10 | 10 | 16 | 16 |
| | CIRCUMFERENTIAL SPEED OF CMP V (m/s) | 1.0 | 0.9 | 1.0 | 1.5 | 2.0 | 2.5 | 1.5 |
| | PRESSURE OF CMP P (kPa) | 10 | 30 | 10 | 10 | 10 | 10 | 12 |
| | SPEED OF CMP (μm/hr) | 0.9 | 2.4 | 2.1 | 2.1 | 1.9 | 0.2 | 2.2 |
| CRYSTAL SUBSTRATE | UNIFORM DISTORTION ($\times 10^{-3}$) | 2.3 | 2.3 | 1.9 | 1.2 | 0.5 | 2.2 | 2.3 |
| | IRREGULAR DISTORTION (arcsec) | 160 | 160 | 130 | 70 | 0 | 150 | 160 |
| | PLANE ORIENTATION DEVIATION (arcsec) | 410 | 410 | 350 | 110 | 0 | 420 | 410 |

| EXAMPLE | | VI-8 | VI-9 | VI-10 | VI-11 | VI-12 | VI-13 |
|---|---|---|---|---|---|---|---|
| CRYSTAL SUBSTRATE | PLANE ORIENTATION OF MAIN SURFACE | (10-11) | (10-11) | (10-111) | (10-16) | (20-21) | (30-31) |
| | INCLINATION ANGLE $\alpha$ (°) | 62 | 62 | 10 | 17 | 75 | 80 |
| CMP CONDITIONS | pH OF SLURRY | 2 | 2 | 2 | 2 | 2 | 2 |
| | ORP OF SLURRY (mV) | 1800 | 1200 | 1500 | 1500 | 1500 | 1500 |
| | CONTACT COEFFICIENT C ($\times 10^{-6}$ m) | 1.0 | 2.0 | 1.5 | 1.5 | 1.5 | 1.5 |
| | VISCOSITY OF SLURRY $\eta$ (mPa·s) | 10 | 16 | 10 | 10 | 10 | 10 |
| | CIRCUMFERENTIAL SPEED OF CMP V (m/s) | 1.0 | 1.5 | 1.5 | 1.5 | 1.5 | 1.5 |
| | PRESSURE OF CMP P (kPa) | 10 | 12 | 10 | 10 | 10 | 10 |
| | SPEED OF CMP (μm/hr) | 2.4 | 1.5 | 1.8 | 2.0 | 2.2 | 2.2 |
| CRYSTAL SUBSTRATE | UNIFORM DISTORTION ($\times 10^{-3}$) | 0.8 | 1.5 | 1.4 | 1.2 | 1.0 | 1.1 |
| | IRREGULAR DISTORTION (arcsec) | 30 | 110 | 90 | 80 | 55 | 60 |
| | PLANE ORIENTATION DEVIATION (arcsec) | 50 | 200 | 190 | 150 | 80 | 100 |

As can be seen from Table 6, CMP was performed using slurry in which value X of pH and value Y (mV) of an oxidation-reduction potential had a relation of:

$$-50X + 1300 \leq Y \leq -50X + 1900$$

and such that contact coefficient C was equal to or more than $1.0 \times 10^{-6}$ m and equal to or less than $2.0 \times 10^{-6}$ m. Accordingly, in the group III nitride crystal substrate with the main surface having a plane orientation inclined in the <10-10> direction at an angle equal to or greater than 10° and equal to or smaller than 80° with respect to one of the (0001) and (000-1) planes, the uniform distortion at the surface layer could be made equal to or less than $1.9 \times 10^{-3}$, the irregular distortion at the surface layer could be made equal to or less than 130 arcsec, and/or the plane orientation deviation of the specific parallel crystal lattice planes ((10-13) planes) of the surface layer could be made equal to or less than 350 arcsec.

Example VII

The GaN crystal substrate (group III nitride crystal substrate) produced in Example II-3 with the main surface having the (20-21) plane orientation was cut up into a plurality of small substrates of a size ranging from 5 mm×20 mm to 5 mm×45 mm. Such plurality of small substrates are arranged such that their main surfaces are in parallel to one another (these main surfaces each having the (20-21) plane orientation and being inclined at an inclination angle of 75° with respect to the (0001) planes), and such that their [0001] direction is identical, and such that their side faces are adjacent to one another, to implement an underlying substrate of a predetermined size. A GaN crystal (group III nitride crystal) was grown by the HYPE method on each of the main surface of these small substrates. The group III nitride crystals were bound together and the peripheral portions were processed on, to thereby obtain a GaN crystal (group III nitride crystal) of a predetermined size.

The obtained GaN crystal was cut in parallel to the main surface of the underlying substrate for producing GaN crystal substrates respectively having main surfaces of 20 mm×20 mm, 30 mm×50 mm, 40 mm in diameter, 100 mm in diameter, and 150 mm in diameter, as well as semiconductor devices, similarly to Example II-3. Such GaN crystal substrates and semiconductor devices all exhibited substrate characteristics and device characteristics equivalent to those in Example II-3.

Further, crystals were grown repeatedly by the HVPE method using these GaN crystal substrates (group III nitride crystal substrates) as the underlying substrate to obtain GaN crystals (group III nitride crystals) respectively having main surfaces of 20 mm×20 mm, 30 mm×50 mm, 40 mm in diameter, 100 mm in diameter, and 150 mm in diameter. Such GaN crystals were subjected to processing similarly to the above, to thereby obtain GaN crystal substrates and semiconductor devices having characteristics equivalent to those in Example II-3.

Example VIII

Using a 150-mm-diameter GaAs crystal substrate as the underlying substrate, a 120-mm-thick GaN crystal substance (group III nitride crystal substance) was grown by the HVPE method. More specifically, the growth of the GaN substance by the HYPE method was performed similarly to Example 1, and such a crystal growth was repeated to obtain the 120-mm-thick GaN crystal substance. The GaN crystal substance thus obtained was sliced at a plane inclined in the [10-10] direction at an inclination angle of 75° with respect to the (0001) planes, and the peripheral portions were processed on, to thereby obtain a 100-mm-diameter GaN crystal with the main surface having the (20-21) orientation. Such GaN crystal was processed on similarly to Example 11-3 to obtain a GaN crystal substrate (group III nitride crystal substrate). A semiconductor device was produced using such GaN crystal substrate similarly to Example II-3. Such GaN crystal substrate and semiconductor device all exhibited substrate characteristics and device characteristics equivalent to those in Example II-3.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A group III nitride crystal substrate, wherein,
a plane spacing of arbitrary specific parallel crystal lattice planes of said crystal substrate being obtained from X-ray diffraction measurement performed with variation of X-ray penetration depth from a main surface of said crystal substrate while X-ray diffraction conditions of said specific parallel crystal lattice planes of said crystal substrate are satisfied,
a uniform distortion at a surface layer of said crystal substrate represented by a value of $|d_1-d_2|/d_2$ obtained from a plane spacing $d_1$ at said X-ray penetration depth of 0.3 μm and a plane spacing $d_2$ at said X-ray penetration depth of 5 μm is equal to or lower than $1.9 \times 10^{-3}$, and
said main surface has a plane orientation inclined in a <10-10> direction at an angle equal to or greater than 10° and equal to or smaller than 80° with respect to one of (0001) and (000-1) planes of said crystal substrate.

2. The group III nitride crystal substrate according to claim 1, wherein said main surface has a surface roughness Ra of 3 nm or lower.

3. The group III nitride crystal substrate according to claim 1, wherein said main surface has a plane orientation inclined at an angle falling within ±4° with respect to any of {20-21}, {10-11}, {20-2-1}, and {10-1-1} planes of said crystal substrate.

4. The group III nitride crystal substrate according to claim 3, wherein said main surface has a plane orientation inclined at an inclination angle having an absolute value of less than 0.1° with respect to any of the {20-21}, {10-11}, {20-2-1}, and {10-1-1} planes of said crystal substrate so as to be substantially parallel thereto.

5. The group III nitride crystal substrate according to claim 3, wherein said main surface has a plane orientation inclined at an inclination angle having an absolute value of equal to or more than 0.1° and equal to or less than 4° with respect to any of the {20-21}, {10-11}, {20-2-1}, and {10-1-1} planes of said crystal substrate.

6. The group III nitride crystal substrate according to claim 1, wherein oxygen present at said main surface has a concentration of equal to or more than 2 at. % and equal to or less than 16 at. %.

7. The group III nitride crystal substrate according to claim 1, wherein a dislocation density at said main surface is equal to or less than $1 \times 10^7$ cm$^{-2}$.

8. The group III nitride crystal substrate according to claim 1, having a diameter equal to or more than 40 mm and equal to or less than 150 mm.

9. The group III nitride crystal substrate according to claim 1, wherein said specific parallel crystal lattice planes are not parallel to said main surface, and is parallel to any of (10-10), (10-11), (10-13), (11-20), (11-22), (11-24), (10-1-1), (10-1-3), (11-2-2), and (11-2-4) planes.

* * * * *